United States Patent [19]
Oka et al.

[11] Patent Number: 5,745,012
[45] Date of Patent: Apr. 28, 1998

[54] VOLTAGE-CONTROLLED OSCILLATOR HAVING A SEMICONDUCTOR INTEGRATED CIRCUIT, A PIEZOELECTRICS RESONATOR AND A DIODE AND VARIABLE-CAPACITANCE DIODE

[75] Inventors: Manabu Oka; Yukari Nakajima; Masayuki Kikushima; Kazuhiko Shimodaira, all of Suwa, Japan

[73] Assignee: Seiko Epson Corporation, Tokyo, Japan

[21] Appl. No.: 785,299

[22] Filed: Jan. 21, 1997

Related U.S. Application Data

[63] Continuation of Ser. No. 601,087, Feb. 14, 1996, Pat. No. 5,631,609.

[30] Foreign Application Priority Data

| Feb. 15, 1995 | [JP] | Japan | 7-27170 |
| Oct. 3, 1995 | [JP] | Japan | 7-256623 |
| Jan. 10, 1996 | [JP] | Japan | 8-2693 |

[51] Int. Cl.[6] .................... H03B 5/36; H01L 41/053
[52] U.S. Cl. .............. 331/68; 331/108 D; 331/116 FE; 331/158; 331/177 V
[58] Field of Search .............. 331/68, 69, 116 R, 331/116 FE, 108 D, 158, 177 V

[56] References Cited

U.S. PATENT DOCUMENTS

| 4,827,226 | 5/1989 | Connell | 331/116 FE |
| 4,916,413 | 4/1990 | Nakayama et al. | |
| 5,030,926 | 7/1991 | Walden | 331/116 FE |
| 5,229,640 | 7/1993 | Pak | 331/68 X |
| 5,302,921 | 4/1994 | Shigemori et al. | |
| 5,392,006 | 2/1995 | Ikeda et al. | |
| 5,592,130 | 1/1997 | Ikeda et al. | 331/68 X |

FOREIGN PATENT DOCUMENTS

| A-61-019204 | 1/1986 | Japan . |
| A-63 232603 | 9/1988 | Japan . |
| A-4 259104 | 9/1992 | Japan . |
| A-4-259104 | 9/1992 | Japan . |
| A-5 243471 | 9/1993 | Japan . |
| A-07 099413 | 4/1995 | Japan . |

*Primary Examiner*—David Mis
*Attorney, Agent, or Firm*—Oliff & Berridge, P.L.C.

[57] ABSTRACT

A voltage-controlled oscillator is provided having a semiconductor integrated circuit and a piezoelectric resonator. A variable-capacitance diode may be connected in series with the piezoelectric resonator. The variable-capacitance diode may be further mounted a land of a lead frame. The piezoelectric resonator, variable-capacitance diode and lead frame may be resin molded into a single unit. In operation, a signal may be applied to a node located between the variable-capacitance diode and the DC-cutting capacitor.

16 Claims, 19 Drawing Sheets

| ITEM | MOLDING MATERIAL OF THE INVENTION | CONVENTIONAL MOLDING MATERIAL |
|---|---|---|
| RELATIVE DENSITY | 2.00 | 1.82 |
| BENDING STRENGTH | 20.0Kg/mm$^2$ | 12.0Kg/mm$^2$ |
| INSTANTANEOUS BENDING STRENGTH | 2.5Kg/mm$^2$ | 1.3Kg/mm$^2$ |
| BENDING MODULUS | 2400Kg/mm$^2$ | 1200Kg/mm$^2$ |
| INSTANTANEOUS BENDING MODULUS | 86.5Kg/mm$^2$ | 100Kg/mm$^2$ |
| GLASS TRANSITION TEMPERATURE | 150°C | 165°C |
| COEFFICIENT OF THERMAL EXPANSION | 1.0X1E-5 | 1.7X1E-5 |

FIG.17

VOLTAGE-CONTROLLED OSCILLATOR HAVING A SEMICONDUCTOR INTEGRATED CIRCUIT, A PIEZOELECTRICS RESONATOR AND A DIODE AND VARIABLE-CAPACITANCE DIODE

This is a Continuation of application Ser. No. 08/601,087 filed Feb. 14, 1996, now U.S. Pat. No. 5,631,609.

BACKGROUND OF THE INVENTION

1. Field of the Invention

The present invention relates to a piezoelectric or voltage-controlled oscillator having a semiconductor integrated circuit and a piezoelectric resonator. The present invention relates to a method of producing the piezoelectric or voltage-controlled oscillator.

2. Description of Related Art

In recent years, great reductions in size and weight have been achieved in various information equipment including HDDs (hard disk drive), portable computers and mobile communication systems such as portable or mobile telephones. As a result, the size and thickness of piezoelectric and voltage-controlled oscillators for use in these devices must be reduced. Thus, there is a need for piezoelectric and voltage-controlled oscillators of a surface mounting type that can be mounted on either surface of a circuit board. FIGS. 19a and 19b illustrate an example of a conventional piezoelectric oscillator employing a quartz-crystal resonator as a piezoelectric resonator. FIGS. 20a and 20b illustrate an example of a conventional voltage-controlled (crystal) oscillator (VCXO).

In the conventional quartz-crystal oscillator shown in FIGS. 19a and 19b, a CMOS IC chip 101 is mounted by a conductive adhesive on an island 103 that is a part of a lead frame 102. The IC chip 101 is electrically connected to input/output lead terminals 105 by Au (wire-bonded) wires 104. A quartz-crystal resonator 106 is fixed to inner leads 107. As shown in FIG. 19b, the quartz-crystal resonator 106 includes a cylinder shaped quartz chip having a circular cross-section with a diameter of about 3 mm. The quartz-crystal resonator 106 is electrically connected to the gate electrode 108 and the drain electrode 109 of the IC chip 101. The IC chip 101, the quartz-crystal resonator 106 and parts of input/output lead terminals 105 are molded by transfer molding with an epoxy resin molding resin to form a plastic package 110 of the quartz-crystal oscillator as best shown in FIG. 19b.

In the conventional voltage-controlled oscillator shown in FIGS. 20a and 20b, electric circuit components such as a transistor 111 and variable-capacitance diode 112 are mounted on a substrate 113 that is fixed by solder on the stem 114 of a metal can package 116. A quartz-crystal resonator 115 is also mounted on the substrate 113. The can 116 is hermetically sealed by resistance welding for example. In another common type, a trimmer capacitor or the like is provided on the substrate 113 and an adjusting hole is formed in the can 116 so that the frequency may be adjusted after the voltage-controlled oscillator is mounted on a circuit board installed in a device such as a mobile communication system.

In the conventional piezoelectric and voltage-controlled oscillators described above, the piezoelectric resonator is accommodated in a cylinder case having a diameter of about 3 mm. As a result, the piezoelectric or voltage-controlled oscillator has a large height such as about 4.5 mm to 7 mm. Thus, its total volume is as great as 0.5 cc to 1.0 cc. The conventional piezoelectric and voltage-controlled oscillators of this type cannot meet the small-size requirements that are essential in small-sized electronic devices such as HDDs portable computers or portable/mobile telephones.

To reduce the thickness of the plastic-molded piezoelectric or voltage-controlled oscillator, the thickness of the piezoelectric resonator must be reduced. There are two known techniques for this purpose.

A first technique is to use a piezoelectric element having a smaller size and dispose it in a cylinder case having a smaller diameter. If the diameter of the piezoelectric resonator is reduced to 1.5 mm, its size will be 0.5 to 0.7 mm (W)×5.6 mm (L) which is much smaller than a typical size of 1.8 to 2.0 mm (W)×5.6 mm (L) of a piezoelectric element disposed in a case having a diameter of 3 mm. However, there is difficulty in designing and producing a piezoelectric element (such as a quartz chip) having such a small size while maintaining the required performance. This technique is therefore expensive and impractical.

A second technique is to reduce the thickness by forming the cross-section of the piezoelectric resonator into an elliptical shape or a track shape (combination of a rectangle and two semicircles). In this technique, the piezoelectric element disposed in the case is allowed to have a size similar to that of the conventional piezoelectric element. Therefore, it is possible to produce a piezoelectric element without increasing the cost.

An example of a piezoelectric oscillator produced using the second technique is disclosed in Japanese Patent Laid-Open No. 4-259104 (1992), the subject matter of which is incorporated herein by reference. In this example, the small-sized oscillator employs a piezoelectric resonator whose cross-section is flat at one end.

When a piezoelectric or voltage-controlled oscillator is molded with resin, projection pressure is uniformly imposed on the piezoelectric resonator and semiconductor integrated circuit disposed in the oscillator.

A hollow case is used with the piezoelectric element disposed therein. Therefore, the case has mechanical strength strong enough not to be deformed by pressure during the molding process so that the piezoelectric element does not come into contact with the inner walls of the case and no strain occurs either in the piezoelectric element or in the mounting part.

Deformation also depends on the shape of the piezoelectric resonator. Computer simulation using structure analysis software has revealed that when using a piezoelectric resonator having an elliptic or track-like cross-section, non-uniform deformation is induced by uniform pressure arising during the molding process. Greater deformation occurs in parts of the case parallel to the major axis of the ellipse or in linear parts of the track shape compared to the cylinder type in which deformation occurs uniformly. Similar results have been observed in experiments on the effects of molding.

Deformation of the case caused by the shrinkage of the molding resin also depends on the location at which the piezoelectric resonator is disposed in the piezoelectric or voltage-controlled oscillator. That is, when the molding resin shrinks and thermal stress occurs in the molding resin, thermal stress varies from part to part of the piezoelectric or voltage-controlled oscillator. Therefore, the location of the piezoelectric resonator and structure of the piezoelectric or voltage-controlled oscillator must be optimized.

In the example shown in Japanese Patent Laid-Open No. 4-259104 (1992), an IC chip is attached to a flat part of the cross-section of the piezoelectric resonator. The piezoelectric resonator and the IC chip are then disposed and molded in a substantially central part of a piezoelectric oscillator with a resin.

However, the area of the flat part must be greater than the area of the IC in order to attach the IC on the flat part of the piezoelectric resonator. Therefore, the area of the flat part must be increased with an increase in the size of the IC chip. To increase the area of the flat part of the piezoelectric resonator, the length of the linear part of the track shape must also be increased. This results in an increase in the pressure applied to the piezoelectric resonator during molding which in turn increases the deformation of the case.

Since the thickness of the resin disposed on the piezoelectric resonator is greater near the IC chip than in an opposite part, the part near the IC chip has greater deformation compared to the opposite part.

As described above, to achieve a reduction in the thickness of a piezoelectric or voltage-controlled oscillator employing a piezoelectric resonator having an elliptic or track-like cross-section, the shape of the cross-section of the piezoelectric resonator and the position at which the piezoelectric resonator is disposed must be optimized.

There is also a need for higher accuracy in the oscillation frequency of piezoelectric and voltage-controlled oscillators.

SUMMARY OF THE INVENTION

It is an object of the present invention to solve the above problems. More specifically, it is an object of the present invention to provide high-accuracy piezoelectric and voltage-controlled oscillators having a small size and thickness at a low cost.

In a first embodiment, a piezoelectric oscillator includes a semiconductor integrated circuit and a piezoelectric resonator. The semiconductor integrated circuit is mounted on an island of a lead frame. The semiconductor integrated circuit is electrically connected to an inner lead of the lead frame by a wire-bonded wire. The piezoelectric resonator has an elliptic cross-sectional shape or a track cross-sectional shape and is disposed adjacent to the semiconductor integrated circuit. A lead of the piezoelectric resonator is electrically connected to part of the lead frame. A signal input lead terminal is electrically connected to the semiconductor integrated circuit so that data in the semiconductor integrated circuit is controlled by the signal input lead terminal. The semiconductor integrated circuit, piezoelectric resonator and lead frame are molded with a resin into a single unit such that the outer part of the inner lead electrode and the signal input lead terminal are exposed to the outside. The oscillation frequency is adjusted by applying a signal to the piezoelectric oscillator by the signal input lead terminal.

In a second embodiment, the piezoelectric oscillator is molded with resin such that the thickness of the resin is disposed on the upper side of the piezoelectric resonator in an equal amount to that on the lower side of the piezoelectric resonator.

In a third embodiment, a surface of the piezoelectric resonator case is exposed to the outside of the piezoelectric oscillator.

In a fourth embodiment, portions along a major axis of the ellipse of the piezoelectric resonator case have a greater thickness in cross-section than other portions of the case. In a similar embodiment, portions along linear portions of the piezoelectric resonator case of the track shape have a greater thickness in cross-section than other portions of the case.

In a fifth embodiment, the piezoelectric oscillator is molded with a molding resin having a bending strength greater than 2 kg/mm$^2$ at a high temperature of 240° C. to 260° C.

In a sixth embodiment, the lead frame is provided with a supporting lead terminal for supporting the piezoelectric oscillator molded with the resin into the single unit.

In a seventh embodiment, the signal input lead terminals used to control the data in the semiconductor integrated circuit are disposed in a line parallel to the piezoelectric resonator at side locations of the semiconductor integrated circuit opposite the piezoelectric resonator.

In an eighth embodiment, input/output pads are formed in peripheral areas on only three sides of the semiconductor integrated circuit while no pads are formed on the side facing the piezoelectric resonator.

In a ninth embodiment, the piezoelectric resonator is a quartz-crystal resonator.

In a tenth embodiment, a method is provided for producing a piezoelectric oscillator including the steps of: mounting a semiconductor integrated circuit on an island of a lead frame and performing wire-bonding so that the semiconductor integrated circuit is electrically connected to an inner lead electrode of the lead frame; and positioning a piezoelectric resonator on the lead frame so that the piezoelectric resonator is disposed adjacent to the semiconductor integrated circuit. The lead of the piezoelectric resonator is then electrically connected to a part of the lead frame. The semiconductor integrated circuit, piezoelectric resonator and lead frame are molded with a resin into a single unit such that the outer part of the inner lead electrode and the signal input lead terminal are exposed to the outside. Tie-bars are cut off connecting the outer part of the inner lead and the signal input lead terminal. A signal is applied to the input lead terminal to adjust the oscillation frequency. The outer part of the inner lead electrode is bent and the signal input lead terminal and the supporting lead terminal are cut to thereby separate the piezoelectric oscillator from the lead frame.

In an eleventh embodiment, data is applied by the signal input lead terminal and NC terminal or OE terminal in the applying step.

In a twelfth embodiment, the frequency is adjusted for a plurality of piezoelectric oscillators remaining connected to the lead frame in the applying step.

In a thirteenth embodiment, a voltage-controlled oscillator is provided including a semiconductor integrated circuit, a piezoelectric resonator and another electronic component. The semiconductor integrated circuit is mounted on an island of a lead frame and is electrically connected to an inner lead of the lead frame by a wire-bonded wire. The piezoelectric resonator having an elliptic cross-sectional shape or a track cross-sectional shape (combination of a rectangle and two semicircles) is adjacent to the semiconductor integrated circuit. A lead of the piezoelectric resonator is electrically connected to a part of the lead frame. The electronic component is mounted on a land of the lead frame. A signal input lead terminal is electrically connected to the semiconductor integrated circuit so that data in the semiconductor integrated circuit is controlled by the signal input lead terminal. The semiconductor integrated circuit, the piezoelectric resonator, the electronic component and the lead frame are molded with a resin into a single unit such that the outer part of the inner lead electrode and the signal input lead terminal are exposed to the outside. The oscillation frequency is adjusted by applying a signal to the piezoelectric oscillator by the signal input lead terminal.

In a fourteenth embodiment, the voltage-controlled oscillator is molded with resin such that the thickness of the resin disposed on the upper side of the piezoelectric resonator is equal to that on the lower side of the piezoelectric resonator.

In a fifteenth embodiment, a surface of the piezoelectric resonator case is exposed to the outside of the voltage-controlled oscillator.

In a sixteenth embodiment, portions along a major axis of the ellipse of the piezoelectric resonator case have a greater thickness in cross-section than other portions of the case. In a similar embodiment, portions along linear portions of the piezoelectric resonator case of the track shape have a greater thickness in cross-section than other portions of the case.

In a seventeenth embodiment, the voltage-controlled oscillator is molded with a molding resin having a bending strength greater than 2 kg/mm$^2$ at a high temperature of 240° C. to 260° C.

In an eighteenth embodiment, the lead frame is provided with a supporting lead terminal for supporting the voltage-controlled oscillator molded with the resin into the single unit.

In a nineteenth embodiment, the signal input lead terminals used to control the data in the semiconductor integrated circuit are disposed in a parallel line to the piezoelectric resonator at side locations of the semiconductor integrated circuit opposite the piezoelectric resonator.

In a twentieth embodiment, input/output pads are formed in peripheral areas on only three sides of the semiconductor integrated circuit while no pads are formed on the side facing the piezoelectric resonator.

In a twenty-first embodiment, the piezoelectric resonator is a quartz-crystal resonator.

In a twenty-second embodiment, the electronic component is a variable-capacitance diode.

In a twenty-third embodiment, a method is provided for producing a voltage-controlled oscillator including the steps of: mounting a semiconductor integrated circuit on an island of a lead frame and performing wire-bonding so that the semiconductor integrated circuit is electrically connected to an inner lead electrode of the lead frame by a wire-bonded wire. A piezoelectric resonator is positioned on the lead frame so that the piezoelectric resonator is disposed adjacent to the semiconductor integrated circuit. The lead of the piezoelectric resonator is then electrically connected to a part of the lead frame. The electronic component is mounted on a land formed in the lead frame. The semiconductor integrated circuit, piezoelectric resonator, electronic component and the lead frame are molded with a resin into a single unit such that the outer part of the inner lead electrode and the signal input lead terminal are exposed to the outside. Tie-bars are cut off that were connecting the outer part of the inner lead and the signal input lead terminal. A signal is applied to the input lead terminal to adjust the oscillation frequency. The outer part of the inner lead electrode is bent. The signal input lead terminal and the supporting lead terminal are cut to separate the voltage-controlled oscillator from the lead frame.

In a twenty-fourth embodiment, data is applied by the signal input lead terminal and VC terminal to adjust the oscillation frequency.

In a twenty-fifth embodiment, the frequency is adjusted for a plurality of voltage-controlled oscillators remaining connected to the lead frame.

In a twenty-sixth embodiment, the piezoelectric resonator and the variable-capacitance diode are connected in series between the input and output terminals of an inverter of the semiconductor integrated circuit. A DC-cutting capacitor is located between the variable-capacitance diode and the inverter. The node between the piezoelectric resonator and the variable-capacitance diode is connected to ground by a bias resistor. A signal is then applied to the node between the variable-capacitance diode and the DC-cutting capacitor.

Other objects, advantages and salient features of the invention will become apparent from the detailed description taken in conjunction with the annexed drawings, which disclose preferred embodiment of the invention.

BRIEF DESCRIPTION OF THE DRAWINGS

The invention will be described with reference to the following drawings in which like reference numerals refer to like elements and wherein:

FIG. 16a illustrates the result for a conventional structure and FIG. 16b illustrates the result for a structure according to the present invention;

FIG. 17 is a table illustrating the properties of a molding resin used in the piezoelectric and voltage-controlled oscillators according to the present invention;

DETAILED DESCRIPTION OF PREFERRED EMBODIMENTS

The present invention of a piezoelectric and/or voltage-controlled oscillator will be described below with reference to preferred embodiments in connection with the accompanying drawings. A quartz-crystal or voltage-controlled oscillator includes a quartz-crystal resonator serving as the piezoelectric resonator accommodated in a plastic package of a SOJ (small outline J-lead) type are used below as examples. These examples are for the purposes of illustration and are not intended to be limiting of the invention. A great part of the voltage-controlled oscillator is the same as the quartz-crystal oscillator. Therefore, the common parts will only be described with reference to the quartz-crystal oscillator so that no duplicated description is necessary.

FIGS. 1, 2, 3, 5, 6, 7, 8, and 9 illustrate the structure, circuit configuration and production method of quartz-crystal oscillators according to first, second, sixth, seventh, eighth, ninth, tenth, eleventh and twelfth embodiments of the invention, respectively.

Figure 1A:
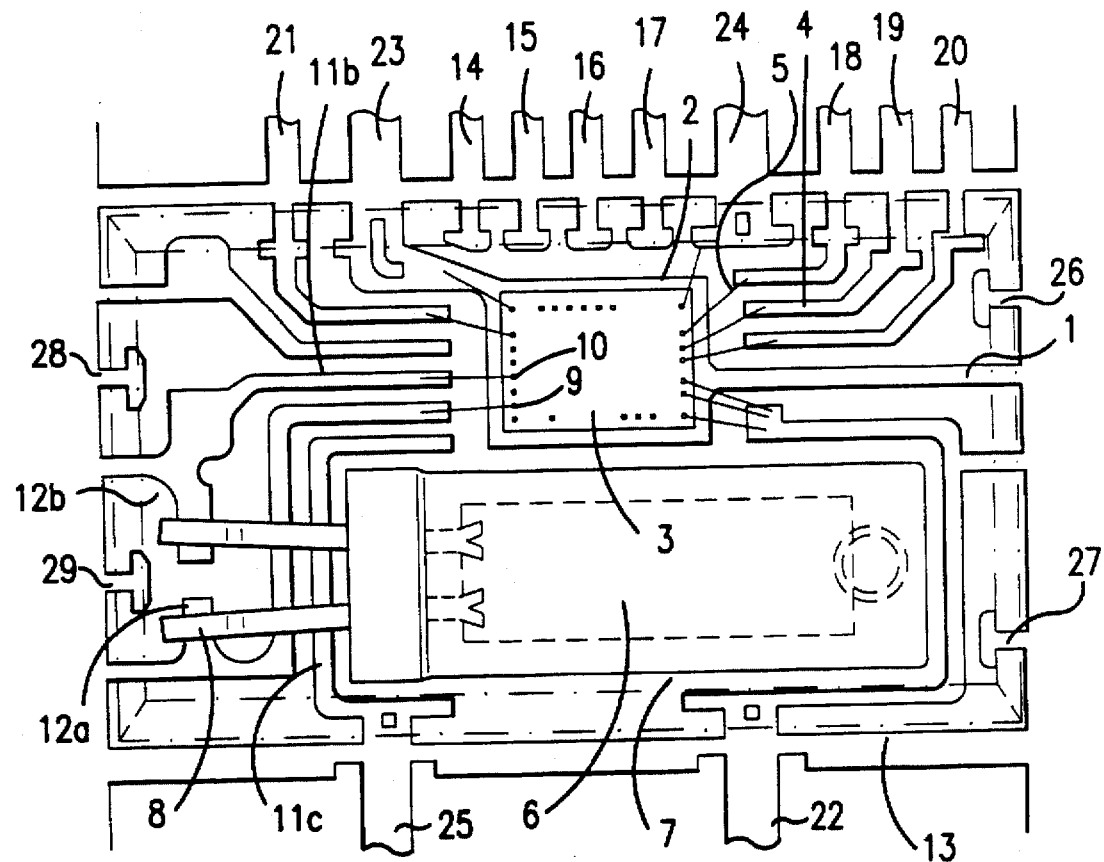
FIGS. 1a–1b are schematic diagrams of an embodiment of a piezoelectric oscillator according to the present invention.
Figure 1B:
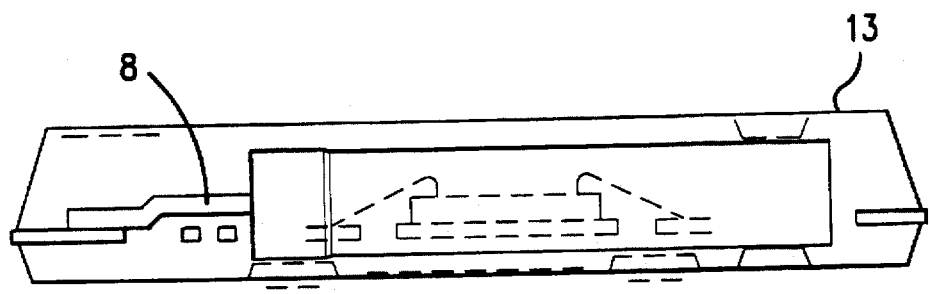

As shown in FIGS. 1a and 1b, a CMOS semiconductor integrated circuit (hereafter IC chip) 3 including an oscillating circuit is die-bonded by conductive adhesive or the like onto an island 2 of a lead frame 1 made up of a high-conductivity metal material such as 42-Alloy having a composition of 42% Ni and 58% Fe or Cu-based alloy. Pads of the IC chip 3 are electrically connected by wire-boded Au wires 5 to inner leads 4 disposed around the island 2. The leads 8 of the quartz-crystal resonator 7 contain a rectangular shaped AT-cut quartz-crystal chip 6 mechanically and electrically connected to mounting areas 12a and 12b of the inner lead electrodes 11a and 11b by resistance spot welding or laser beam welding. The XG terminal 9 (on the gate side) and the XR terminal 10 (on the drain side) of the IC chip 3 are electrically connected to the inner lead electrodes 11a and 11b by wire-boded Au wires 5 so that the quartz-crystal resonator 7 is driven by the IC chip 3 to create oscillation.

As shown in FIG. 1b, the leads 8 are bent so that they cross over inner leads 11b and 11c and connect to the mounting areas 12a and 12b. The leads 8 have a length long enough to overhang the mounting areas 12a and 12b. Thus, the quartz-crystal resonator 7 is disposed on the lead frame 1 adjacent the IC chip 3.

Furthermore, the quartz-crystal resonator 7 is located so that the thickness of the resin on the upper side is equal to that on the lower side. In this example, the thickness of the resin is set to about 0.2 mm for either side. On a longer side of the quartz-crystal oscillator 13, signal input terminals (D0 terminal 14, D1 terminal 15, D2 terminal 16, D3 terminal 17, D4 terminal 18, D5 terminal 19, D6 terminal 20, and control terminal 21) are provided to apply signals for controlling the oscillation frequency of the quartz-crystal oscillator 13. The signal input lead terminals are disposed at the side of the IC chip 3 opposite and parallel to the quartz-crystal resonator 7.

Figure 2:
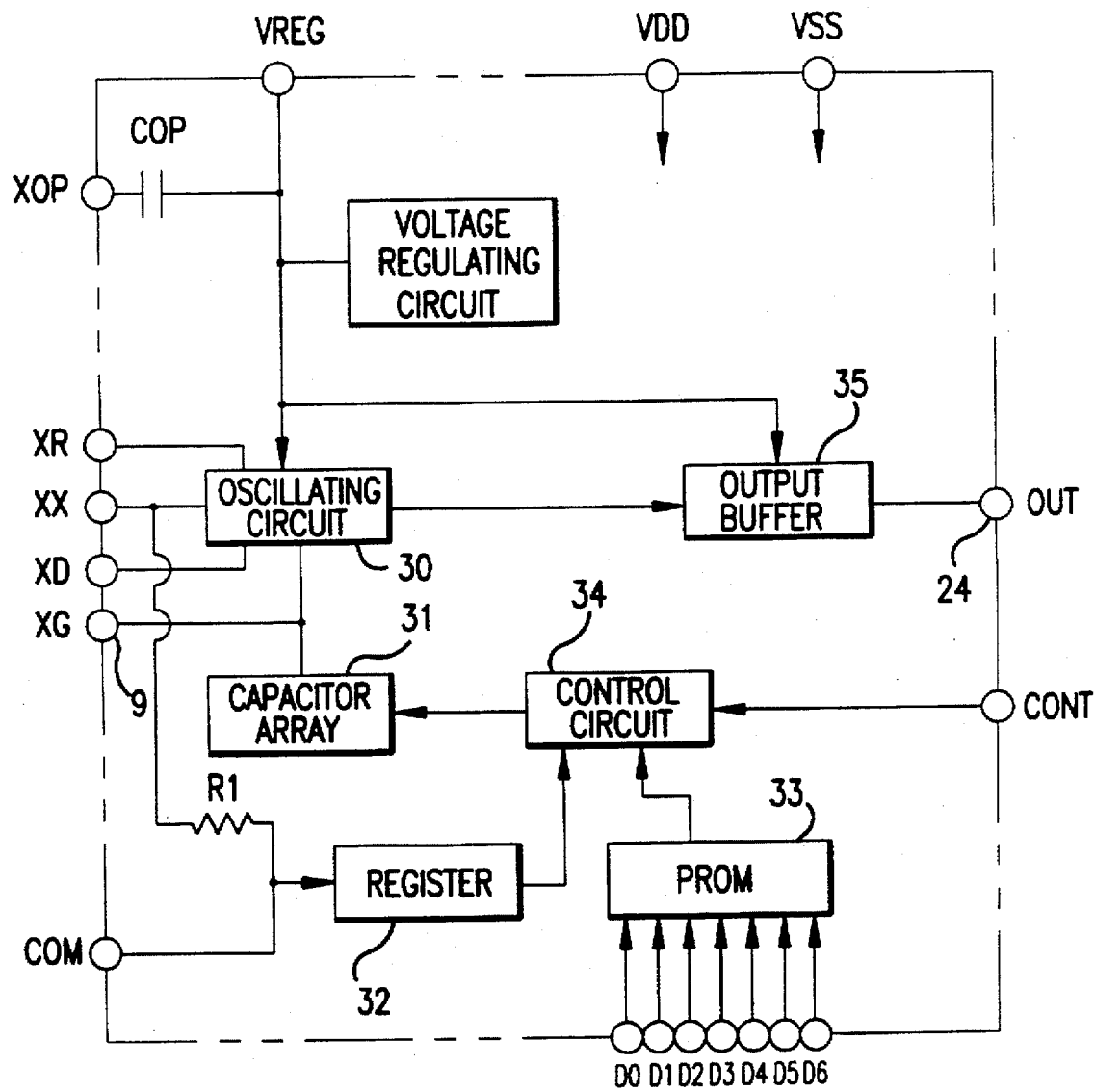
FIG. 2 is a block diagram of the piezoelectric oscillator according to the present invention.

Furthermore, the quartz-crystal oscillator 13 also includes a VSS terminal 22, VDD terminal 23, OUT terminal 24 and NC/OE terminal 25 as shown in FIG. 2.

The lead frame 1 is also provided with supporting lead electrodes 26, 27, 28 and 29 for supporting the quartz-crystal oscillator 13 during a process of adjusting the oscillation frequency.

As shown in FIG. 2, the IC chip 3 is single chip semiconductor device which includes an oscillating circuit 30, a capacitor array 31, a register 32, a PROM 33, a control circuit 34 and an output buffer 35 which are programmed to change the capacitance associated with the XG terminal 9 by controlling the capacitor array 31 according to frequency adjustment data and frequency dividing condition data to control the frequency of the oscillation based on the quartz oscillation. The oscillation signal is output by the OUT terminal 24.

The oscillating circuit 30 includes a feedback resistor, a CMOS inverter and gate and drain capacitance. The capacitor array 31 including seven capacitors for controlling the frequency is coupled to the gate capacitance. The register 32 stores frequency adjustment data that is supplied from the outside to control the oscillation frequency according to the given program. The established data determined after the adjustment of the frequency is written in the PROM 33 and stored therein. The control circuit 34 controls the capacitor array 31 according to the frequency adjustment data stored in the PROM 33 or register 32. The output buffer 35 amplifies the oscillation signal generated by the oscillating circuit 30.

As shown in FIG. 1a, pads for use in this quartz-crystal oscillator 13 are formed in peripheral areas on only three sides of the IC chip 3. No pads are formed on the side of the IC chip 3 facing the quartz-crystal resonator 7. These pads are electrically connected to the inner lead electrodes 4 by wire-bonded Au wires 5.

Figure 3A:
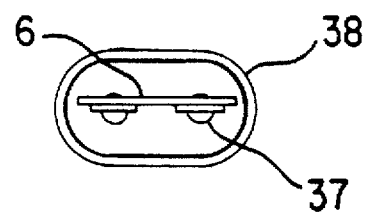
FIGS. 3a–3b are schematic diagrams of a piezoelectric resonator used in a piezoelectric and voltage-controlled oscillator according to the present invention.
Figure 3B:
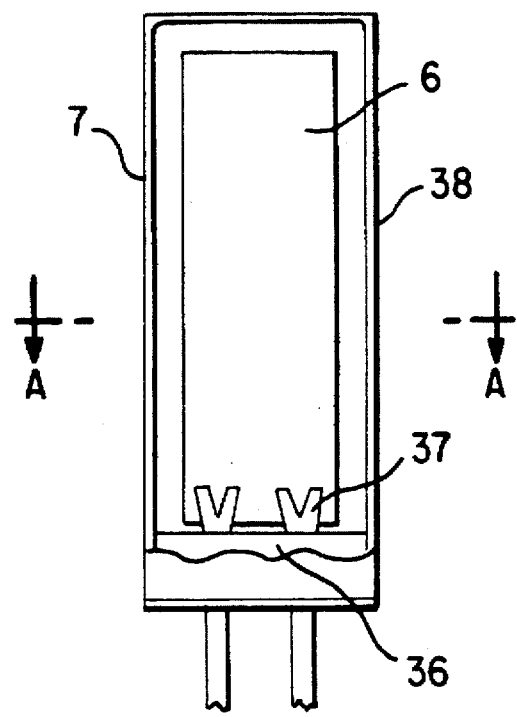

As shown in FIG. 3a and 3b, the quartz-crystal resonator 7 is formed so that its cross-section has a shape similar to a track (a combination of a rectangle and two semicircles). A rectangular AT quartz-crystal chip 6 of convention size is mounted on the inner leads 37 connected to a hermetic-seal terminal (plug) 36 and sealed in a case 38. As a result of the case 38 and the hermetic terminal 36 having a track-like cross-section shape, it is possible to accommodate the AT quartz-crystal chip 6 having a conventional size in a case as thin as about 1.5 mm. Thus, a quartz-crystal resonator 7 having a very small thickness can be obtained. The cross-sectional shape of the quartz-crystal resonator 7 is not limited to the above described track shape but may also have other shapes such as an ellipse as described below.

Figure 4A:
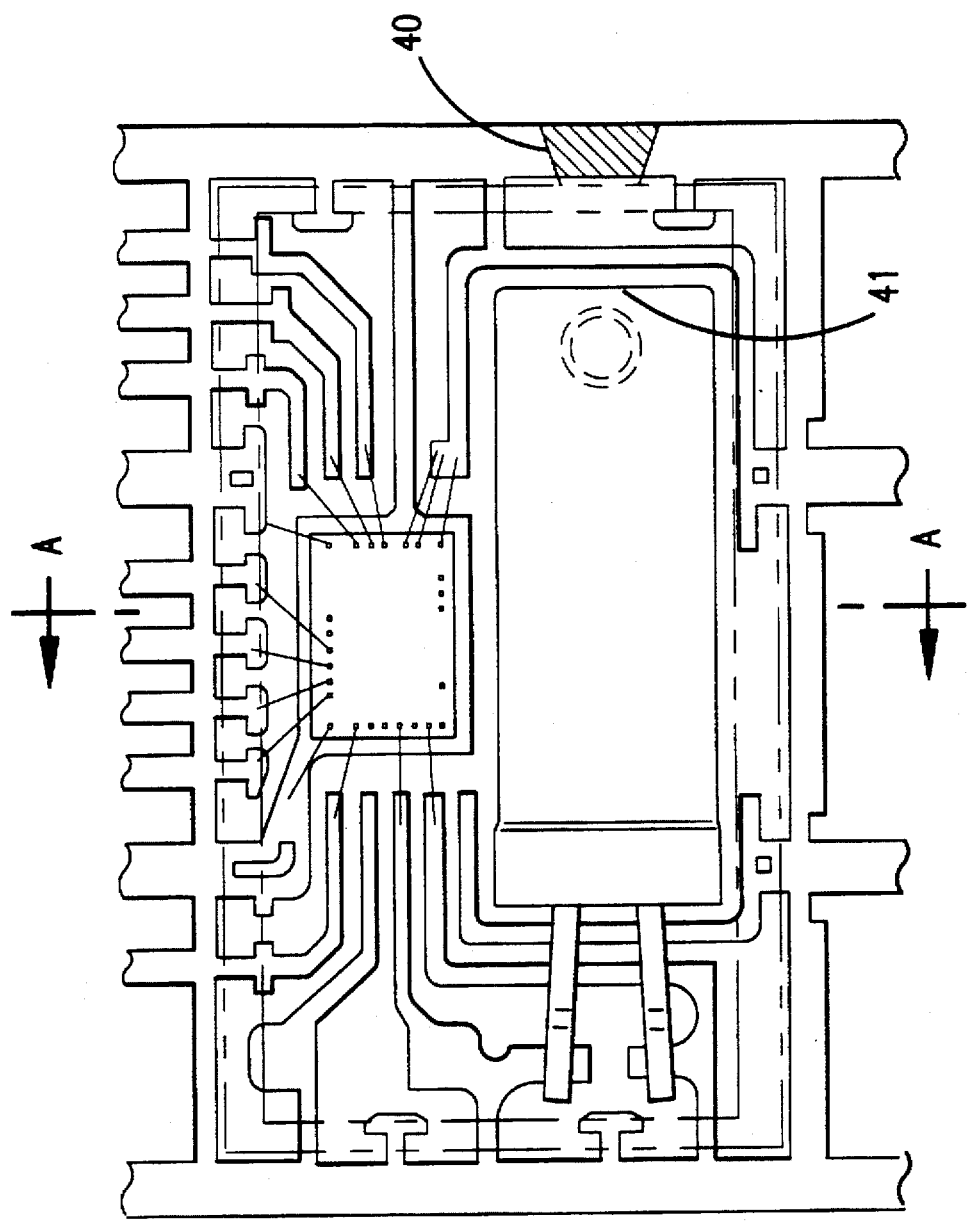
FIGS. 4a–4c are schematic diagrams of a piezoelectric oscillator placed in a transfer mold according to the present invention.
Figure 4B:
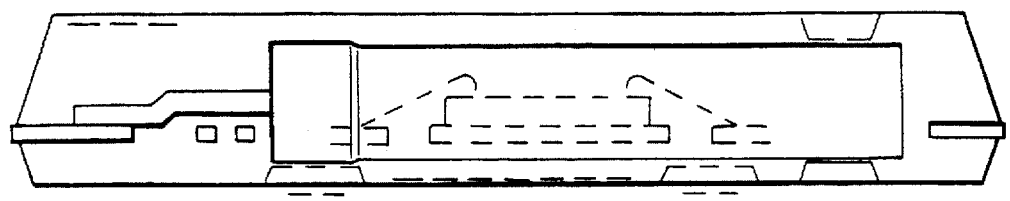
Figure 4C:
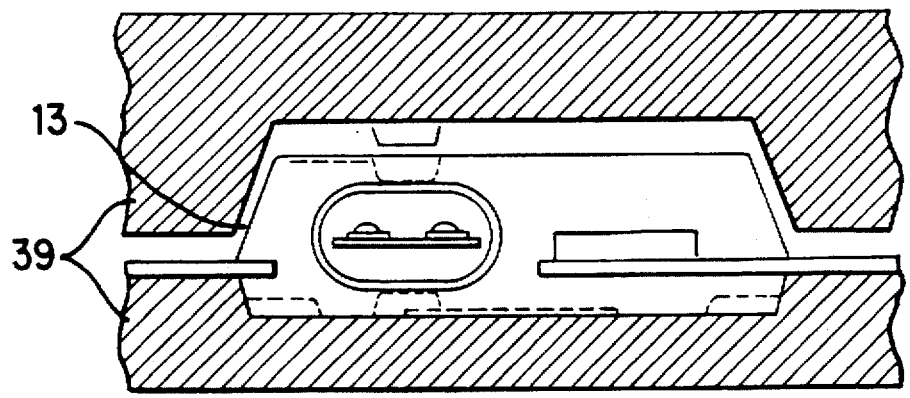

As shown in FIGS. 4a, 4b and 4c, the lead frame 1 is placed in a transfer mold 39 and transfer-molded with resin except at outer portions of the inner lead electrodes 4 and the signal input lead terminals (D0 terminal 14, D1 terminal 15, D2 terminal 16, D3 terminal 17, D4 terminal 18, D5 terminal 19, D6 terminal 20 and control terminal 21) to obtain a quartz-crystal oscillator 13. In this embodiment, a gate 40 is formed on a shorter side of the quartz-crystal oscillator 13 to inject molding resin so that the molding resin collides with the end portion 41 of the case of the quartz-crystal resonator 7 to uniformly distribute the molding resin.

Figure 5:
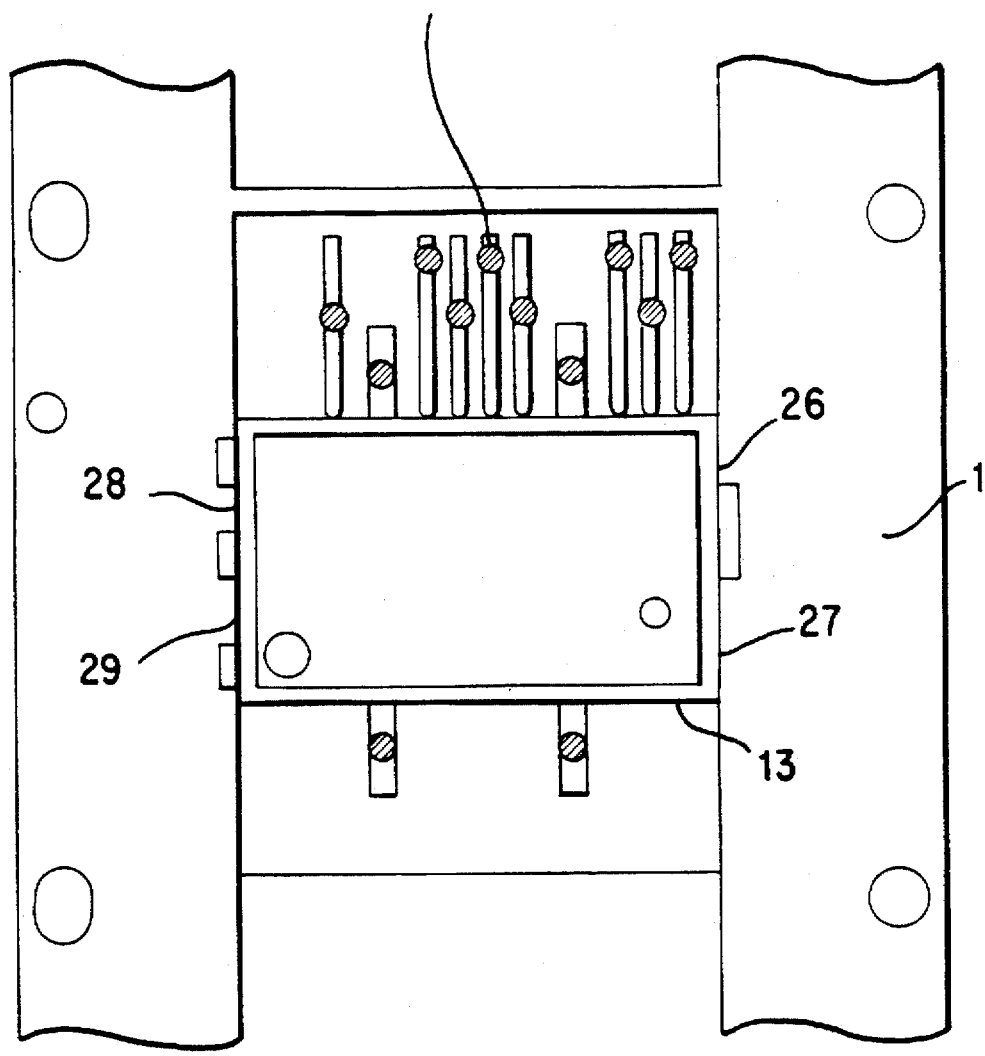
FIG. 5 is a piezoelectric oscillator subjected to a frequency adjustment step according to the present invention.

After resin molding, tie-bars used for connection between input/output electrodes and signal input lead terminals (D0 terminal 14, D1 terminal 15, D2 terminal 16, D3 terminal 17, D4 terminal 18, D5 terminal 19, D6 terminal 20 and control terminal 21) are trimmed off. Thus, a plurality of quartz-crystal oscillators 13 (ten quartz-crystal oscillators in this embodiment) are formed on one lead frame 1 as shown in FIG. 5. Each quartz-crystal oscillator 13 is connected to the lead frame 1 by supporting leads 26, 27, 28 and 29. The supporting leads 26, 27, 28 and 29 are formed so that they are isolated from each other and have no connection to any of the input/output leads and signal input leads.

When the frequency is adjusted, pin probes are placed on the leads at positions indicated by the solid circles in FIG. 5. Since a plurality of quartz-crystal oscillators 13 are supported by the lead frame 1 as described above, it is possible to adjust the frequency of the quartz-crystal oscillators 13 without having to separate the quartz-crystal oscillators 13 from the lead frame 1. The frequency adjustment may be performed in an one-by-one fashion or for a plurality of quartz-crystal oscillators at the same time. This allows the frequency adjustment process to be incorporated into the production line, thus making it is possible to reduce the production cost of the quartz-crystal oscillator.

Figure 6:
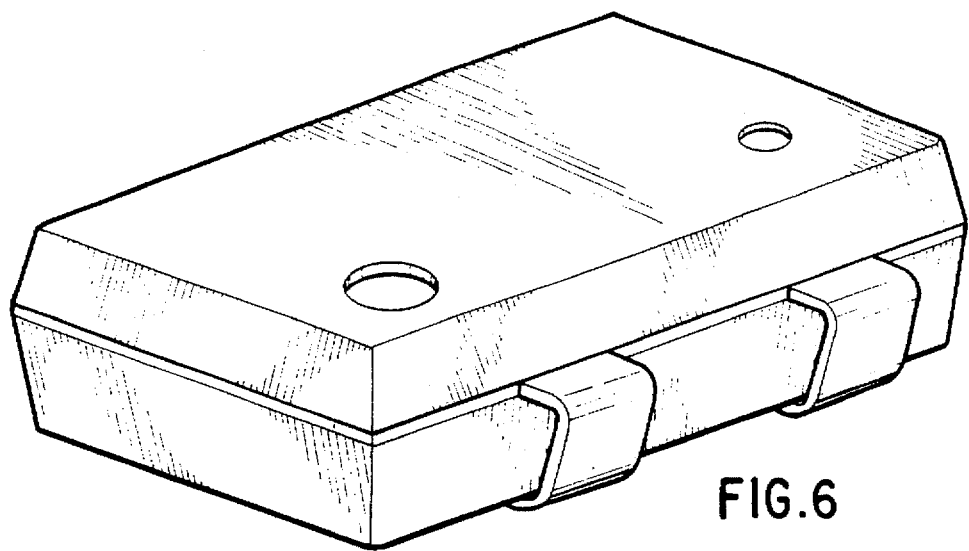
FIG. 6 is a piezoelectric oscillator according to the present invention.
Figure 7:
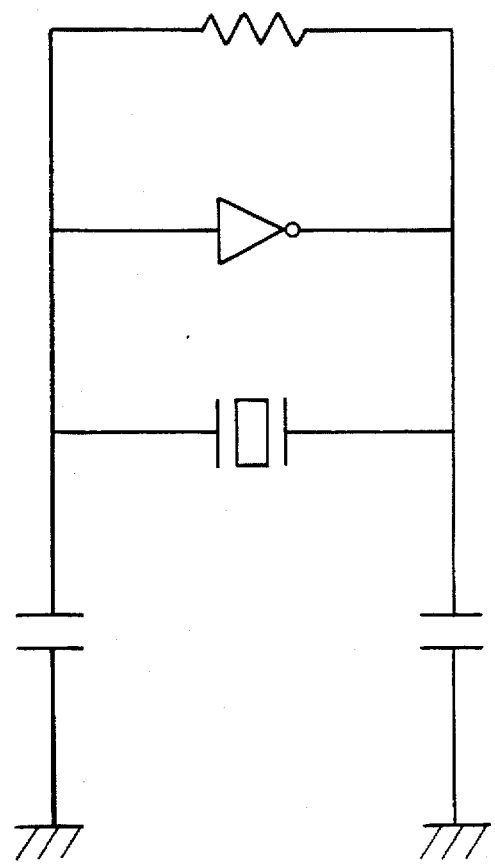
FIG. 7 is a circuit diagram of a piezoelectric oscillator according to one embodiment of the present invention.

After adjusting the frequency, the quartz-crystal oscillators 13 are cut off (i.e., trimmed) from the lead frame 1. In this process, the input/output leads such as the VSS electrode 22, the VDD electrode 23, the OUT electrodes 24 and the NC/OE electrode 25 are first bent into a J-shape. The signal input leads (D0 terminal 14, D1 terminal 15, D2 terminal 16, D3 terminal 17, D4 terminal 18, D5 terminal 19, D6 terminal 20 and control terminal 21) are then cut off. Finally, the connecting portions between the supporting leads 26, 27, 28, 29 and the lead frame 1 are cut off. Thus, each quartz-crystal oscillator 13 is separated to obtain a complete quartz-crystal oscillator of the SOJ type as shown in FIG. 6.

The above described quartz-crystal oscillator has a thickness as small as about 2.0–2.2 mm and a volume of about 0.2 cc.

The cross-section of the quartz-crystal resonator has a special shape as described above to ensure that the resin is uniformly coated in thickness around the quartz-crystal resonator. As a result, the filling efficiency of the molding resin may be improved. Furthermore, the quartz-crystal oscillator has no cracks in its package and thus has a high reliability.

In the above described embodiment, the quartz-crystal oscillator can precisely adjust the oscillation frequency. However, the present invention may also be applied to a simple quartz-crystal oscillator such as that shown in FIG. 7 including only an oscillating circuit using a general CMOS circuit.

Figure 8:
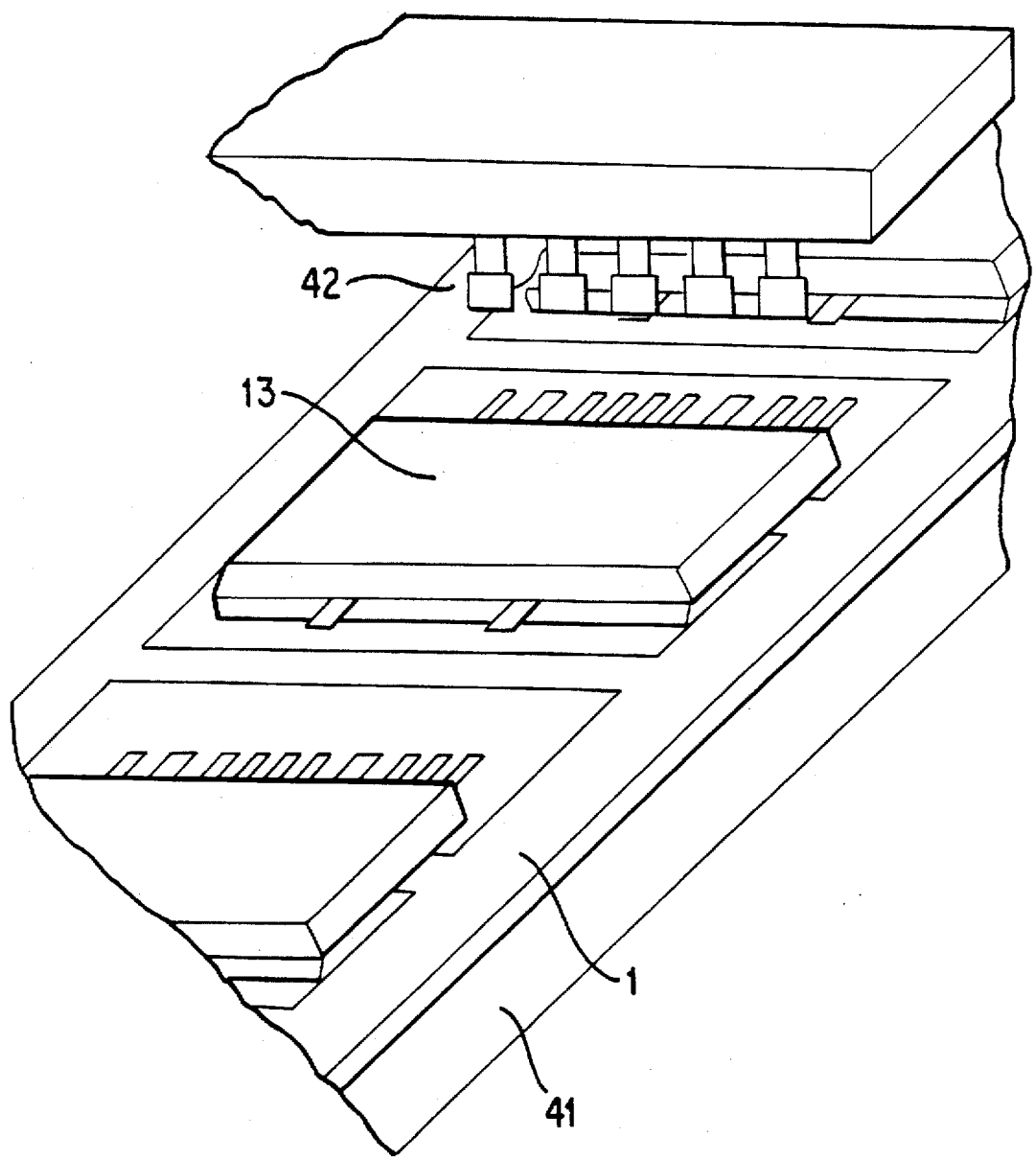
FIG. 8 is a piezoelectric oscillator subjected to a frequency adjustment step according to the present invention.

The oscillation frequency of the quartz-crystal oscillator shown in FIG. 5 can be adjusted as described below. As shown in FIG. 8, a plurality of quartz-crystal oscillators 13 connected to a lead frame 1 are placed on a frequency adjusting device 42. The oscillation frequency is automatically adjusted according to the following steps.

Figure 9:
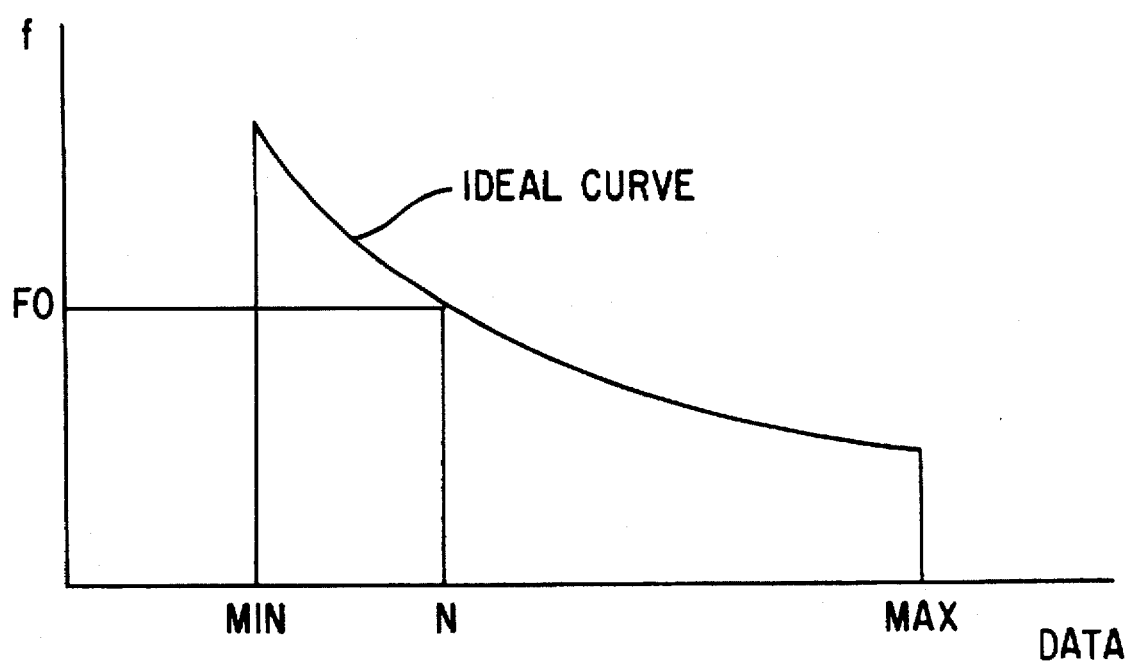
FIG. 9 is a graph illustrating an ideal characteristic curve used to adjust the frequency of the piezoelectric oscillator according to the present invention.

The pin probes 43 of the frequency adjusting device 42 are placed so that the pin probes 43 come into electrical contact with the respective leads of the quartz-crystal oscillators 13. Voltages are applied to the VDD electrode 23 and the VSS electrode 22 so that the quartz-crystal resonator 7 starts oscillating operation. The MIN data indicated by the ideal curve shown in FIG. 9 is input into the counter of the frequency adjusting device 42. A high-level and a low-level signal are then applied to the control terminal 21 and the NC/OE terminal 25, respectively, of the quartz-crystal oscillator 13. As a result, the capacitor array 31 is controlled based on the data stored in the register 32 by the controller 34 instead of the data stored in the PROM 33. N pulses are then input to the register 32 by the NC/OE terminal 25 so that data N is stored in the register 32. The frequency (F1) of the oscillating signal output by the OUT terminal 24 is monitored. If the oscillation frequency (F1) is equal to the target frequency (F0), the frequency adjustment is complete. If the oscillation frequency (F1) is not equal to the target frequency (F0), the above process is repeatedly performed until the oscillation frequency (F1) reaches the target frequency (F0).

The data, which has been obtained in the above-described frequency adjustment, is then written in the PROM 33 to store the result. The writing of the data into the PROM 33 is performed by disconnecting fuses in the PROM 33 corresponding to the terminals having "0" level when the data in binary form corresponds to the respective terminals from D0 14 to D6 20. The disconnection of the fuses is performed by applying a writing voltage to the terminals connected to the fuses to be disconnected while maintaining the VDD terminal 23 at the ground level.

FIG. 8 shows only one example of how the frequency is adjusted. That is, the pin probes 43 may be placed in another direction. Furthermore, the piezoelectric oscillator may be placed on the frequency adjusting device 42 in either an upright or up-side-down manner.

The above described method of production is only one of many possible examples within the scope of this invention.

Figure 10A:
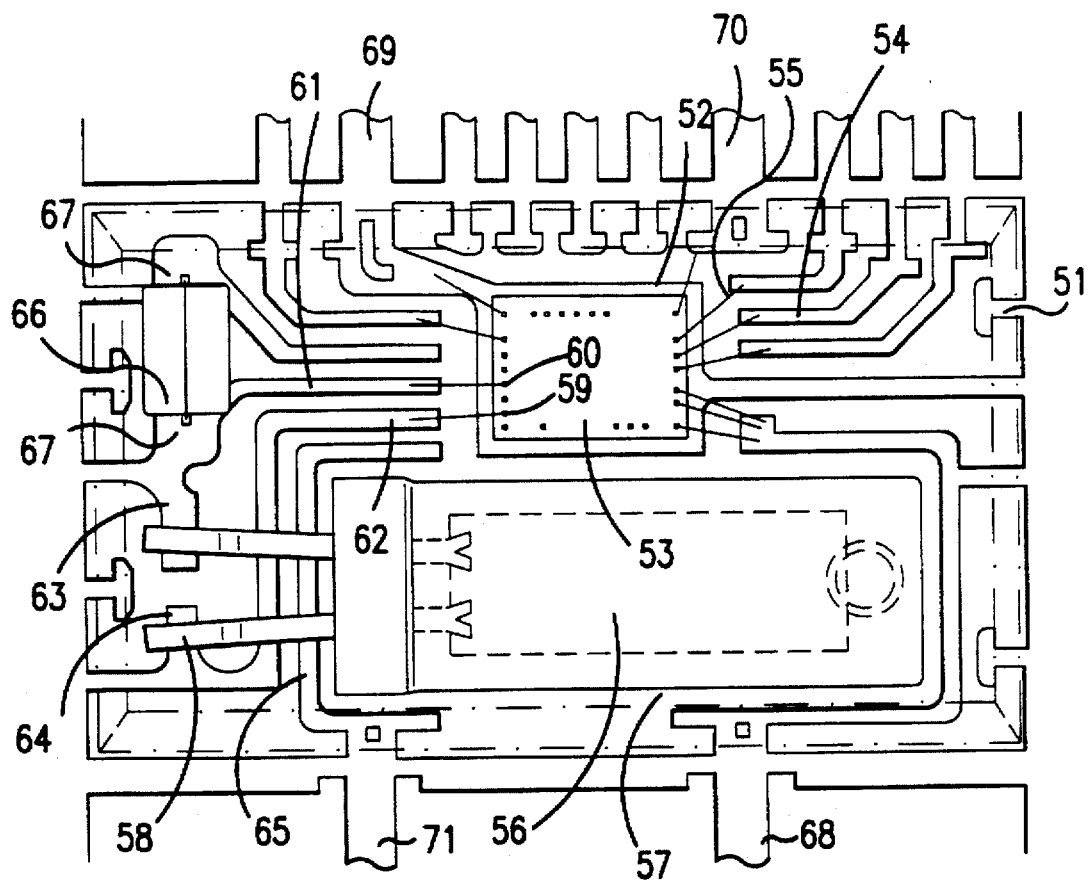
FIGS. 10a–10b are schematic diagrams of an embodiment of a voltage-controlled oscillator according to the present invention.
Figure 10B:
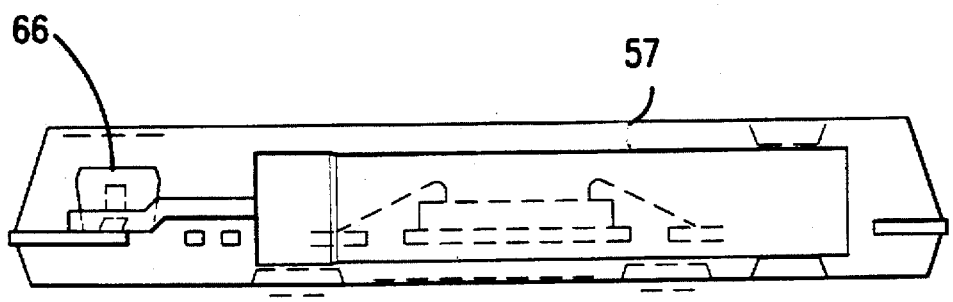
Figure 11:
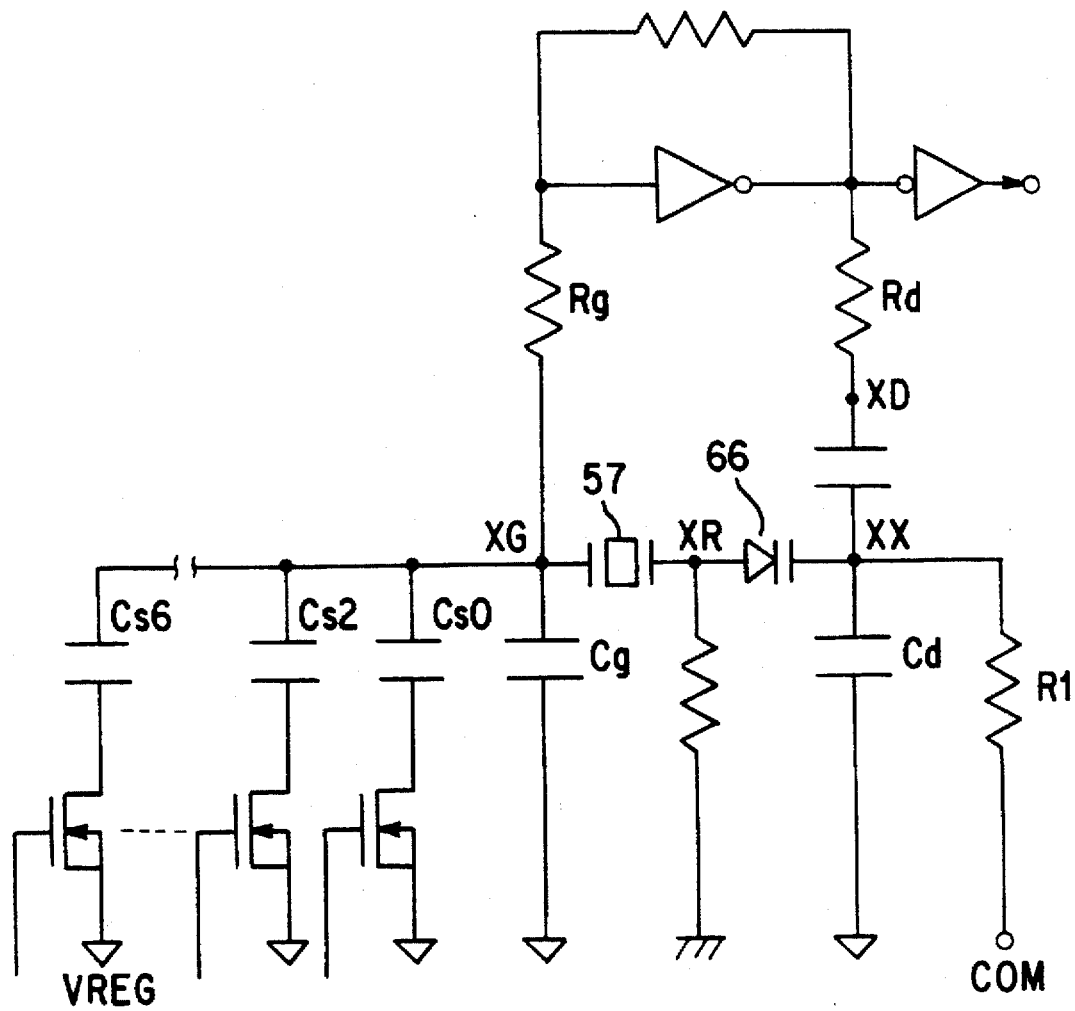
FIG. 11 is a circuit diagram illustrating the voltage-controlled oscillator according to the present invention.
Figure 12:
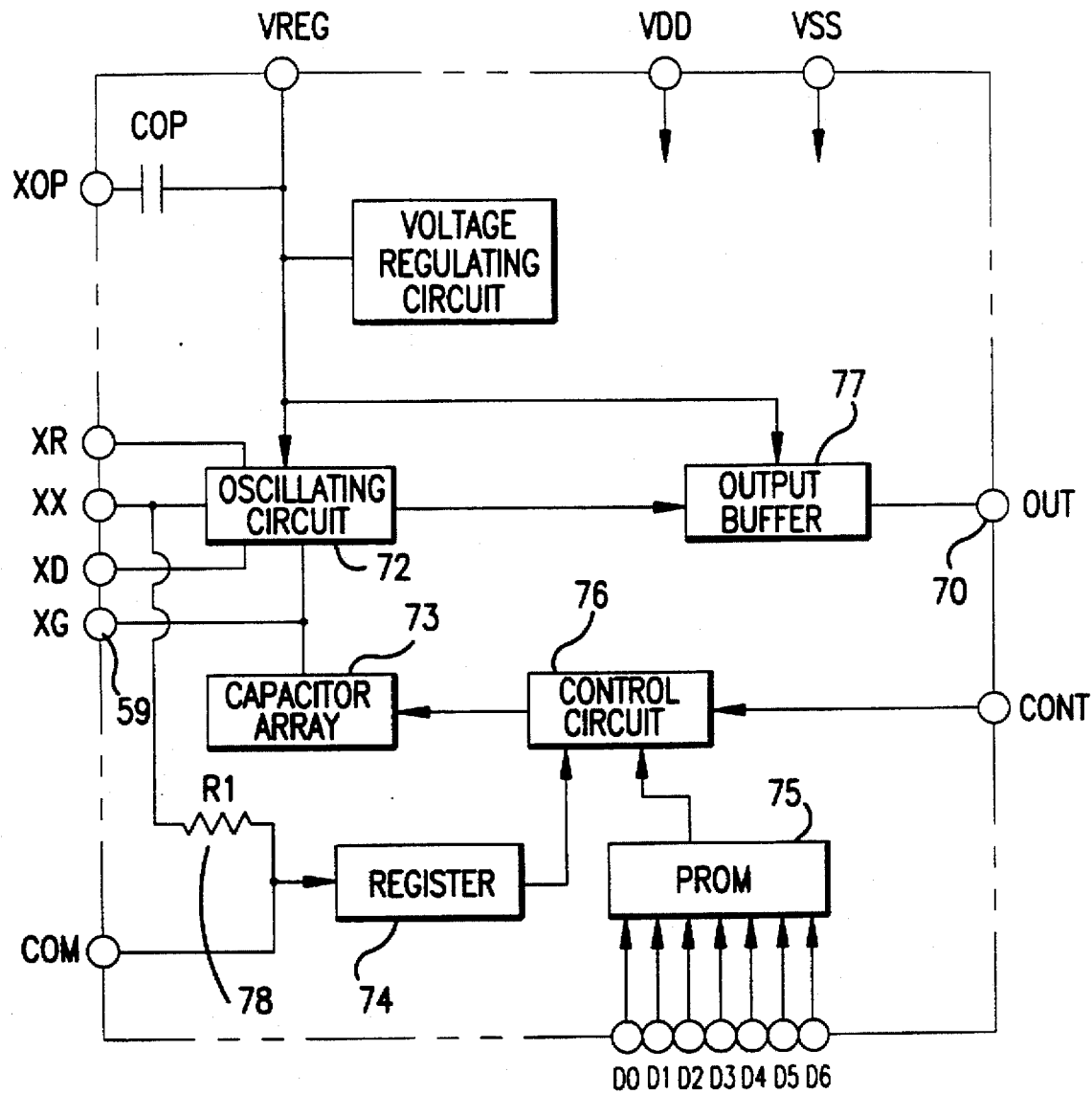
FIG. 12 is a voltage-controlled oscillator according to the present invention.

FIGS. 10, 11 and 12 are a schematic diagram, circuit diagram and block diagram, respectively, of voltage-controlled oscillators according to the thirteenth, fourteenth, eighteenth, nineteenth, twentieth, twenty-first, twenty-second, twenty-third, twenty-fourth, twenty-fifth and twenty-sixth embodiments of the invention.

As shown in FIGS. 10a and 10b, a CMOS IC chip 53 is die-bonded by conductive adhesive onto an island 52 of a lead frame 51 made up of a high-conductivity metal material such as 42-Alloy having a composition of 42% Ni and 58% Fe or Cu-based alloy. The pads of the IC chip 53 are electrically connected by wire-bonded Au wires 55 to the inner leads 54 disposed around the island 52. The leads 58 of the quartz-crystal resonator 57 (containing a rectangular shaped AT quartz-crystal chip 56) are mechanically and electrically connected to mounting areas 63 and 64 of the inner lead electrodes 61 and 62 by resistance spot welding or laser beam welding. The XG terminal 59 (on the gate side) and the XR terminal 60 (on the drain side) of the IC chip 53 are electrically connected to the inner lead electrodes 61 and 62 by wire-bonded Au wires 55 so that the quartz-crystal resonator 57 is driven by the IC chip 53 to create oscillation.

As shown in FIG. 10b, the leads 58 of the quartz-crystal resonator 57 are bent so that they cross over inner leads 60 and 65 and are connected to the mounting areas 63 and 64. Furthermore, the leads 8 have a length long enough to overhang the mounting areas 63 and 64 to dispose the quartz-crystal resonator 57 on the lead frame 51.

Similar to the resonator 7 described above with respect to FIG. 3, the cross-section of the quartz-crystal resonator 57 also resembles a track shape (combination of a rectangle and two semicircles). The quartz-crystal resonator 57 is constructed by mounting a rectangular AT quartz-crystal chip on inner leads of a hermetic electrode, placing it in a case and finally sealing the case. The quartz-crystal resonator 57 has a size as thin as about 1.5 mm.

Electronic components such as a variable-capacitance diode 66 as shown in FIG. 11 are attached to the land 67 of the lead frame 51 by resistance spot welding, laser beam welding, soldering or adhesive.

The connecting positions of the quartz-crystal resonator 57 and the variable-capacitance diode 66 are located on the same straight line so that a welding head can be easily and quickly moved to a correct position and attach two different components at different positions.

In the embodiment shown in FIG. 11, the oscillating circuit of the voltage-controlled oscillator includes an inverter, a feedback resistor, and an oscillation capacitor. The quartz-crystal resonator 57 and the variable-capacitance diode 66 are connected in series between the input and output terminals of the inverter. A DC-cutting capacitor is disposed between the variable-capacitance diode 66 and the inverter. The node XR between the piezoelectric resonator 57 and the variable-capacitance diode 66 is connected to ground by a bias resistor. A control voltage or modulation signal is applied to the node XX between the variable-capacitance diode 66 and the DC-cutting capacitor to change the capacitance of the variable-capacitance diode 66 and thus the oscillation frequency. Signal input leads and supporting leads are also provided as in the quartz-crystal oscillator.

Input/output terminals also including a VSS terminal 68, a VDD terminal 69, an OUT terminal 70 and a VC terminal 71.

As shown in FIG. 12, the IC chip 53 is an single chip semiconductor device that includes an oscillating circuit 72, a capacitor array 73, a register 74, a PROM 75, a control circuit 76 and an output buffer 77 which are programmed to change the capacitance associated with the XG terminal 59 by controlling the capacitor array 73 based on frequency adjustment data and frequency dividing condition data to control the frequency of the oscillation based on the quartz oscillation. The oscillation signal is output by the OUT terminal 70.

The IC chip 53 also includes a resistor 78 connected to the node between the quartz-crystal resonator 57 and the variable-capacitance diode 66 to serve as an input resistor of the VC terminal 71.

The lead frame is placed in a transfer mold and transfer-molded with resin except for outer portions of the inner leads 54 and signal input lead terminals to obtain a voltage-controlled oscillator.

The oscillation frequency is adjusted in a similar manner to the quartz-crystal oscillator described above. However, unlike the quartz-crystal oscillator in which the NC/OE is used, the VC terminal 71 is used to adjust the oscillation frequency of the voltage-controlled oscillator.

Figure 13:
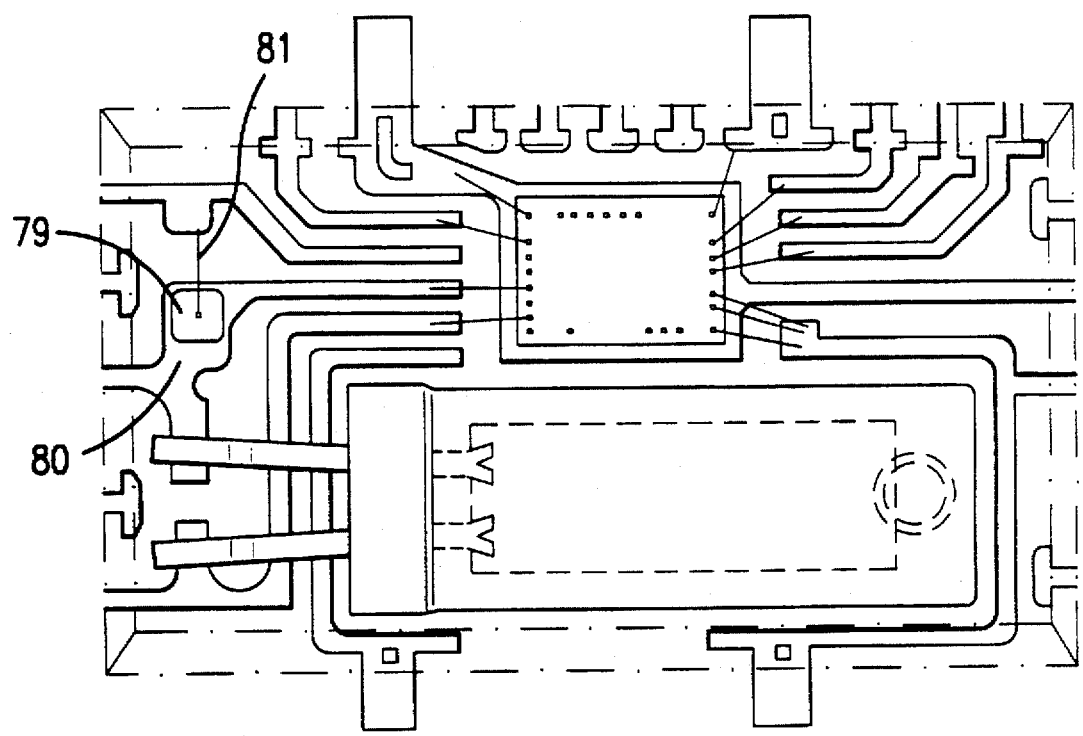
FIG. 13 is another embodiment of a voltage-controlled oscillator according to the present invention.

FIG. 13 illustrates another embodiment of a voltage-controlled oscillator based on a thirteenth aspect of the invention. A variable-capacitance diode 79 (chip type) is used in this voltage-controlled oscillator. The variable-capacitance diode 79 is attached to the land 80 by conductive adhesive and an electrical connection is made by a wire-bonded Au wire 81.

The above described voltage-controlled oscillator has a thickness preferably as small as about 2.0–2.2 mm and a volume as small as about 0.2 cc.

The cross-section of the quartz-crystal resonator has the special shape to ensure that the resin is uniformly coated around the quartz-crystal resonator. As a result, the filling efficiency of the molding resin may be improved. Furthermore, the voltage-controlled oscillator has no cracks in its package and thus shows high reliability.

In this voltage-controlled oscillator, it is possible to change the oscillation frequency by the amount of ±20 ppm relative to the center frequency by changing the voltage applied to the VC terminal 71 within a range from 1.2 V to 1.8 V.

Figure 14:
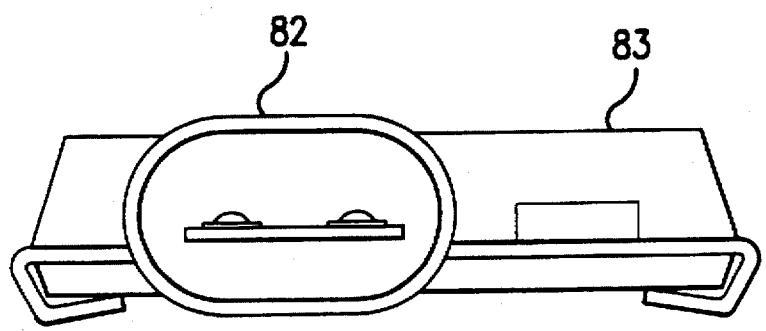
FIG. 14 is still another embodiment of a piezoelectric and voltage-controlled oscillator according to the present invention.

FIG. 14 illustrates another embodiment based on a third or fifteenth aspect of the invention in which a quartz-crystal resonator 82 having a cross-section of an elliptic or track shape is disposed in a quartz-crystal or voltage-controlled oscillator such that the quartz-crystal resonator 82 is partly exposed to the outside of a package 83.

This allows further reduction in the thickness of the quartz-crystal oscillator or the voltage-controlled oscillator to a value equal to the thickness of the quartz-crystal resonator itself (or 1.5 mm).

Thus, the quartz-crystal resonator is in direct contact with ambient air to remove heat more effectively from the IC chip 53 to prevent the heat from expanding in the quartz-crystal resonator.

Figure 15A:
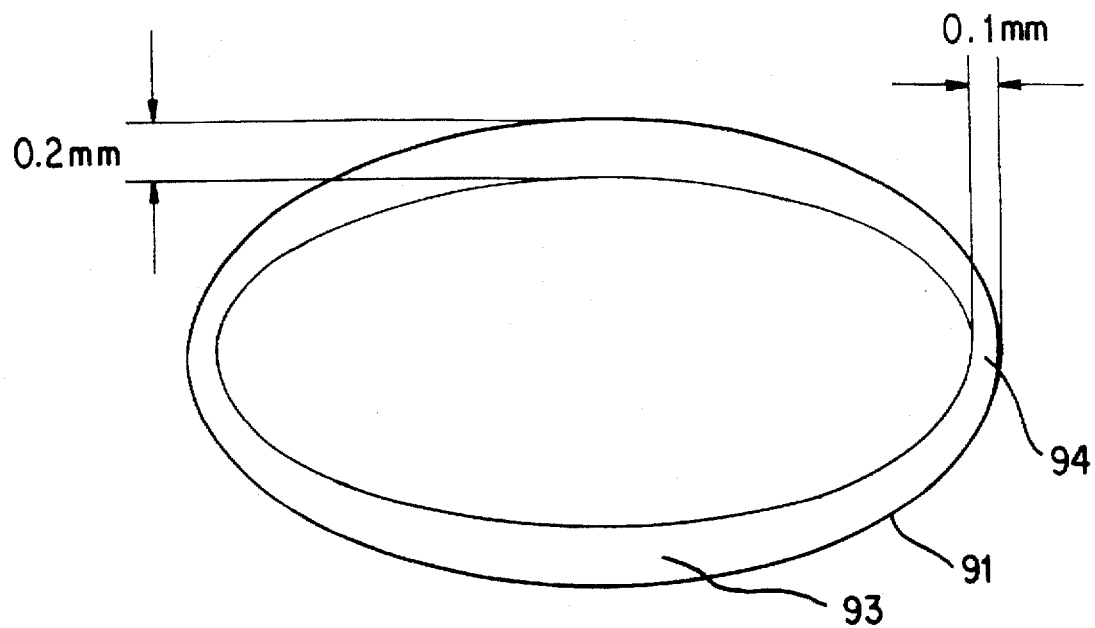
FIGS. 15a–15b are schematic diagrams illustrating an elliptic and track-like structure of the piezoelectric resonator used in the piezoelectric and voltage-controlled oscillators.
Figure 15B:
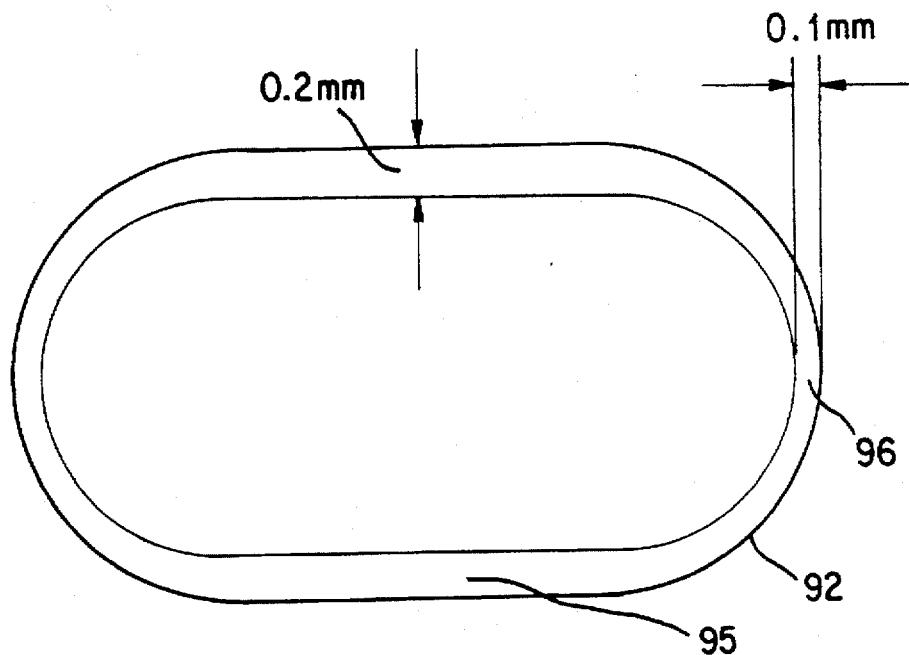

FIGS. 15 and 16 illustrate the shape of cases used for a quartz-crystal resonator according to a fourth and sixteenth embodiments of the invention. The case 91 of the quartz-crystal resonator has an elliptic shape (cross-section) while the case 92 shown in FIG. 15b has a track shape (cross-section). The case 92 includes rounded ends and substantially flat portions connecting the rounded ends.

Case 91 has a wall thickness that changes from part to part. The wall thickness of part 93 along the major axis of the ellipse is about 1.5 to 2 times greater than a thickness of a part 94 along the minor axis. The thickness of the part 93 along the major axis has a range from 0.15 mm to 0.2 mm. The thickness of the part 94 along the minor axis has a range of about 0.1 mm. Parts 93 and 94 are connected to each other by a continuously curved part.

Case 92 has a wall thickness that also changes from part to part. The wall thickness of linear part 95 is about 1.5 to 2 times greater than the wall thickness of arc part 96.

The thickness of the linear part 95 is in a range from 0.15 mm to 0.2 mm while the thickness of the arc part 96 is about 0.1 mm. Parts 95 and 96 are also connected to each other by a continuously curved part.

For both cases 91 and 92, the parts that are likely to be deformed by pressure of an injected molding resin have a thickness greater than the other parts so that the cases have enough mechanical strength against such pressure. This makes it possible to reduce the size of the piezoelectric resonator to the smallest possible thickness. This structure also leads to a reduction in the amount of case material, which results in a lower cost.

Figure 16A:
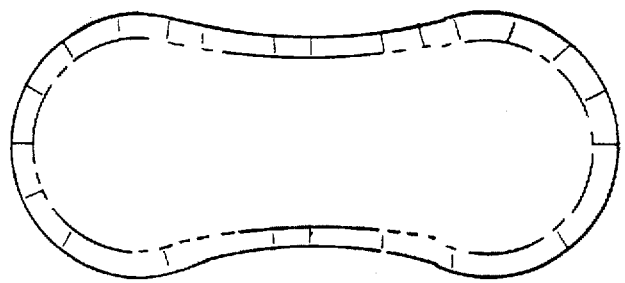
FIGS. 16a–16b are representations of the result of computer analysis on the deformation using structural analysis software, where
Figure 16B:
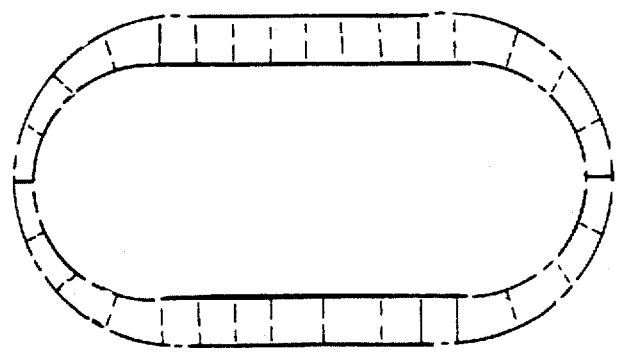

Computer analysis using structural analysis software has shown that the deformation of the cases according to the present invention are as small as a quarter or less of that of conventional cases. FIG. 16 illustrates the result of the structural analysis for the case 92 having a track shape cross-section. In this analysis, the deformation of the case is calculated when a pressure is uniformly applied against the outer surface of the case. The result for the conventional case is shown in FIG. 16a while the result for the case according to the present invention is shown in FIG. 16b.

As can be seen, if the case is formed into either shape according to the present invention, deformation of the case can be reduced at the part 93 along the major axis of the ellipse or at the linear part 95 of the track shape. This means that the case having a shape according to the present invention ensures that piezoelectric and voltage-controlled oscillators have high reliability.

FIG. 17 illustrates characteristics of a molding resin employed for either a piezoelectric or voltage-controlled oscillator according to the fifth or seventeenth embodiments. The molding resin has a bending strength of about 2.5 kg/mm$^2$ at a high temperature of 240° C. to 260° C., which is much higher than a bending strength of 1.2 kg/mm$^2$ to 1.5 kg/mm² for conventional molding resins. The molding resin having such a high bending strength ensures that the piezoelectric and voltage-controlled oscillators can withstand the reflowing stress that occurs when mounted on a circuit board. In particular, when the cross-section of the piezoelectric resonator is either an elliptic shape or a track-like shape as in the present invention and thus the case of the piezoelectric resonator is in contact with the resin over a large contact area, separation may occur at the interface between the case and the resin during a reflowing process or cracks may be produced in the package. A molding resin having a high bending strength is effective to prevent such problems.

Figure 18:
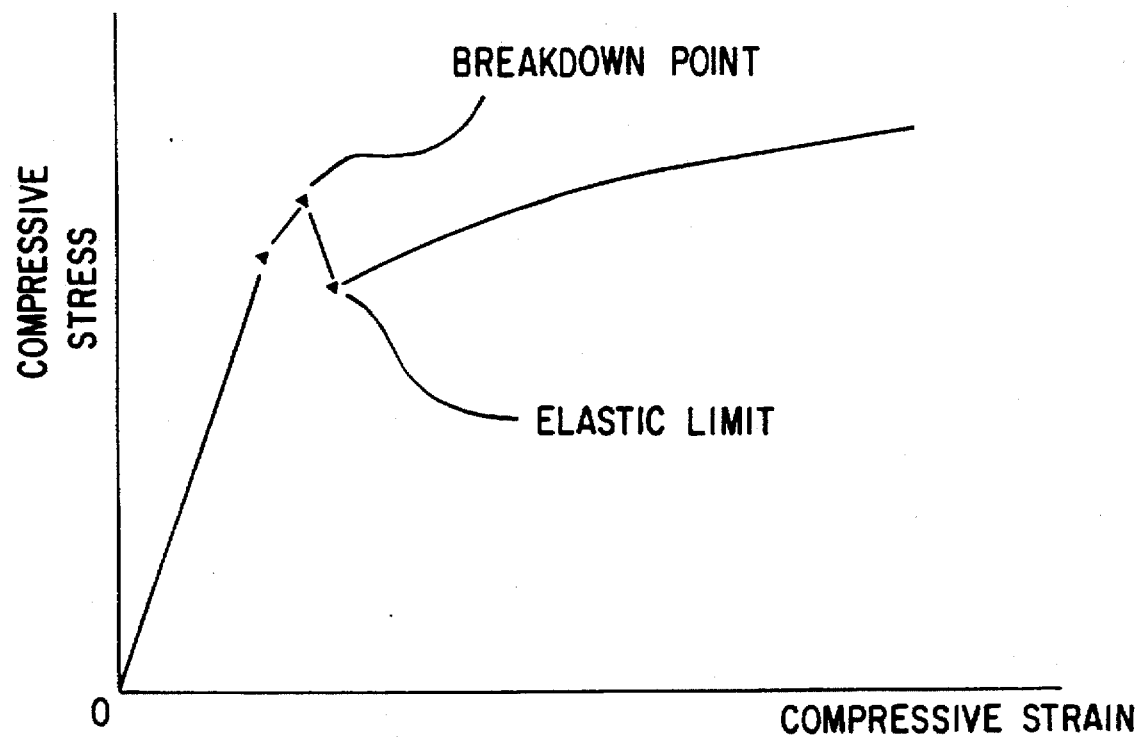
FIG. 18 is a graph illustrating the deformation (strain) of a piezoelectric resonator case caused by the injection pressure during a molding process.
Figure 19A:
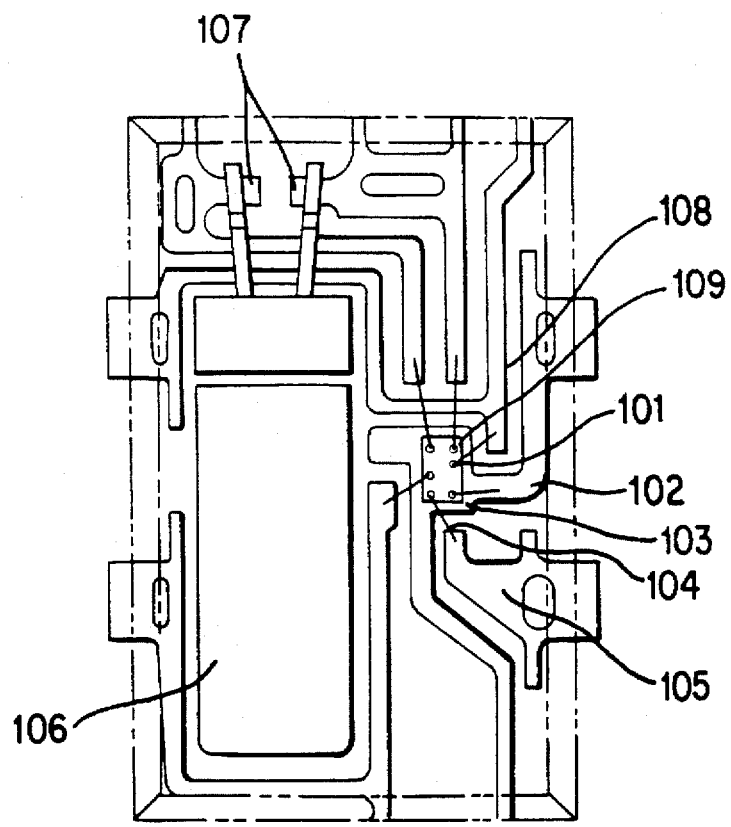
FIGS. 19a–19b are diagrams of a conventional piezoelectric oscillator.
Figure 19B:
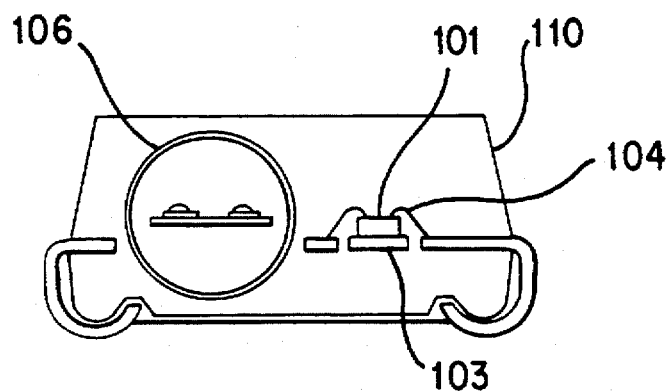
Figure 20A:
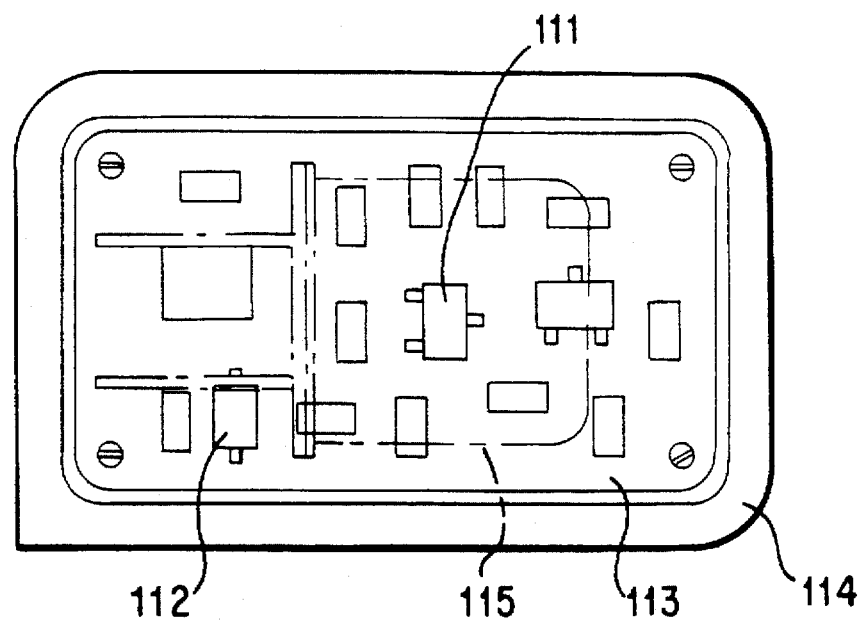
FIGS. 20a–20b are diagrams of a conventional voltage-controlled oscillator.
Figure 20B:
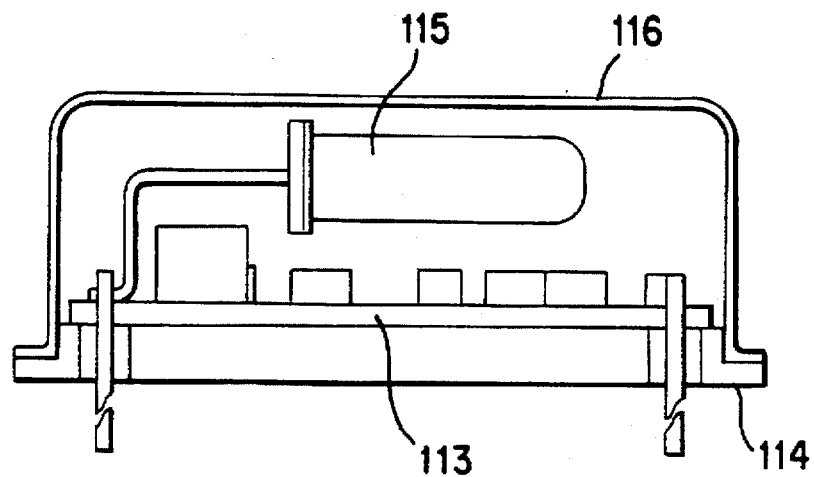

FIG. 18 illustrates deformation of the case of the quartz-crystal resonator caused by injection pressure during molding process. This graph is a plot of compressive stress (injection pressure) versus compression strain. As can be seen, if deformation occurs during a molding process, the deformed shape returns to the original shape as long as the case is deformed within the elastic deformation range (elastic limit) shown in FIG. 18. However, if the case is deformed beyond the elastic limit, the case no longer returns to the original shape. In this embodiment, the injection pressure is controlled within the elastic deformation range taking into account the characteristics of the transfer molding machine and the structure of the mold used. For example, the pressure at the ram of the transfer molding machine is set to about 18 kg/cm². Furthermore, in this embodiment, 42-alloy containing Fe and Ni is used as the case material. The molding pressure is optimized taking into account the stress-strain characteristics of this material.

The molding process is performed such that the deformation of the case falls within the elastic deformation range to prevent the case from permanent deformation.

The above described embodiment uses a SOJ-type package as the package for the piezoelectric and voltage-controlled oscillators. However, the invention is not limited to this type of package. Other types of packages such as a SOP (small outline package) may also be used.

In the first embodiment a piezoelectric resonator having a cross-sectional elliptic shape or track shape (combination of a rectangle and two semicircles) is mounted on a lead frame so that the piezoelectric resonator is adjacent to a semiconductor integrated circuit. These elements are then molded with a resin. Thus, a small-sized surface mounting piezoelectric oscillator can be obtained. This piezoelectric resonator is covered with resin having a uniform thickness. Thus, it is possible to uniformly supply molding resin during a molding process. As a result, a high-reliability piezoelectric oscillator may be produced having no cracks in its package.

In a second embodiment, molding is performed so that the thickness of the resin on an upper side of the piezoelectric resonator is equal to the thickness of the resin on the lower side. This ensures a uniform pressure is applied to the piezoelectric resonator case during the molding process to prevent deformation. Furthermore, molding resin may be uniformly supplied during a molding process to cover the piezoelectric resonator with a uniform thickness. Thus, a high-reliability piezoelectric oscillator may be produced having no cracks in its package.

In a third embodiment, a piezoelectric resonator having a cross-sectional elliptic shape or track-like shape is partly exposed to the outside of a piezoelectric oscillator. This makes it possible to obtain a piezoelectric oscillator having a very small thickness. This structure is also effective to remove the heat generated in the piezoelectric oscillator.

In a fourth embodiment, when an ellipse cross-sectional shape is used as the case of the piezoelectric resonator, the case is formed so that parts of the case along the major axis of the ellipse have a wall thickness greater than the other parts. On the other hand, in a similar embodiment, when a track-like shape is used, the case is formed so that linear parts of the case have a wall thickness greater than the other parts. This ensures that the case is deformed less than conventional cases. Therefore, the molding process can be performed without imposing any influence on the inside of the case of the piezoelectric resonator to improve the production yield.

In a fifth embodiment, the molding resin has a bending strength greater than 2 kg/mm² at a high temperature. Thus, a piezoelectric oscillator may be produced without having either separation at the interface between the case and the resin or cracks in the package during a reflowing process. This piezoelectric oscillator also shows high quality and reliability.

In a sixth embodiment, a supporting lead terminal for supporting the piezoelectric oscillator is formed on the lead frame to allow measurement of electrical characteristics and adjustment of the frequency without having to separate it from the lead frame. Thus, the adjustment and measurement process can be incorporated into the production line.

In a seventh embodiment, signal input lead terminals is input, are disposed in parallel to the piezoelectric resonator at side locations of the semiconductor integrated circuit opposite to the piezoelectric resonator to input data for controlling the semiconductor integrated circuit. This allows a reduction in the size of the piezoelectric oscillator to a very small thickness. Furthermore, it is very easy to adjust the oscillation frequency since signal input lead terminals are disposed in a line on a side of the package.

In an eighth embodiment, input/output pads are formed on peripheral areas of only three sides of the IC chip while no pads are formed on the side of the IC chip facing the quartz-crystal resonator. This allows a reduction in the size of the piezoelectric oscillator to a very small thickness.

In a ninth embodiment, a quartz-crystal resonator is used as the piezoelectric resonator to produce a small-sized piezoelectric oscillator having high performance and reliability at a low cost.

In a tenth embodiment, a production method includes the steps of: mounting a semiconductor integrated circuit and a piezoelectric resonator on a lead frame; molding these elements with resin; and adjusting the frequency by applying a signal to the signal input lead terminal. This method can be performed using an existing production line. Thus, a small-sized piezoelectric oscillator may be produced having high reliability at a low cost.

In an eleventh embodiment, data is applied by the signal input lead terminal and the NC terminal or OE terminal to allow the terminals to share by input and output signals. In a twelfth embodiment, frequency adjustment is performed on a plurality of piezoelectric oscillators remaining on a lead frame without being separated from the lead frame. The frequency of a large number of piezoelectric oscillators may be simultaneously adjusted to reduce the time required for producing and evaluating the piezoelectric oscillators.

In a thirteenth embodiment, a piezoelectric resonator having a cross-sectional elliptic shape or track-like shape is mounted on a lead frame so that it is adjacent an IC chip and other electronic components. These elements are then molded with resin to obtain a surface mounting voltage-controlled oscillator having a very small thickness.

Furthermore, molding resin may be uniformly supplied during a molding process to cover the piezoelectric resonator with resin of a uniform thickness. Therefore, it is possible to produce a high-reliability voltage-controlled oscillator having no cracks in its package.

In a fourteenth embodiment, molding is performed so that the thickness of the resin disposed on the upper side of the piezoelectric resonator is equal to the thickness of the resin disposed on the lower side. This ensures uniform pressure is applied to the case of the piezoelectric resonator during the molding process to minimize deformation of the case. Furthermore, molding resin may be uniformly supplied during a molding process to cover the piezoelectric resonator with resin of uniform thickness. Therefore, a high-reliability voltage-controlled oscillator may be produced having no cracks in its package.

In a fifteenth embodiment, a piezoelectric resonator having a cross-sectional elliptic shape or track-like shape is partly exposed to the outside of a voltage-controlled oscillator to obtain a voltage-controlled oscillator having a very small thickness. This structure is also effective to remove heat generated in the voltage-controlled oscillator.

In a sixteenth embodiment, when an ellipse shaped case is used, the case is formed so that parts of the case along the major axis of the ellipse have a wall thickness greater than other parts. On the other hand, in a similar embodiment, when a track-like shaped case is used, the case is formed so that linear parts of the case have a wall thickness greater than the other parts. This ensures the case is deformed less than conventional cases. Therefore, the molding process can be performed without imposing any influence on the inside of the case of the voltage-controlled oscillator to improve the production yield.

In a seventeenth embodiment, molding resin having a bending strength greater than 2 kg/mm$^2$ at a high temperature is used to produce a voltage-controlled oscillator without having either separation at the interface between the case and the resin or cracks in the package during a reflowing process. Thus, the obtained voltage-controlled oscillator shows high quality and reliability.

In an eighteenth embodiment, a supporting lead terminal for supporting the voltage-controlled oscillator is formed in the lead frame. This allows measurement of electrical characteristics and adjustment of the frequency to be performed on the voltage-controlled oscillator without having to separate it from the lead frame. Thus, the adjustment and measurement process can be incorporated into the production line.

In a nineteenth embodiment, signal input lead terminals, are disposed in parallel to the piezoelectric resonator at side locations of the semiconductor integrated circuit opposite to the piezoelectric resonator to input data for controlling the semiconductor integrated circuit. This allows reduction in size of the voltage-controlled oscillator to a very small thickness.

Furthermore, signal input lead terminals are disposed in a line on a side of the package to make it easy to adjust the oscillation frequency.

In a twentieth embodiment, input/output pads are formed in peripheral areas on only three sides of the semiconductor integrated circuit while no pads are formed on the side facing the quartz-crystal resonator. This allows a reduction in the size of the voltage-controlled oscillator to a very small thickness.

In a twenty-first embodiment, a quartz-crystal resonator is used as a piezoelectric resonator to produce a small-sized voltage-controlled oscillator having high performance and reliability at a low cost.

In a twenty-second embodiment, a variable-capacitance diode is used as the electronic component to provide a small-sized voltage-controlled oscillator having high performance and reliability.

In a twenty-third embodiment, a production method includes the steps of: mounting a semiconductor integrated circuit, a piezoelectric resonator and an electronic component on a lead frame; molding these elements with resin; and adjusting the frequency by applying a signal to the signal input lead terminal. This production method can be performed using an existing production line. Thus, a small-sized voltage-controlled oscillator may be produced having high reliability at a low cost.

In a twenty-fourth embodiment, data is applied by the signal input lead terminal and the VC terminal to allow the terminals to be shared by input and output signals.

In a twenty-fifth embodiment, frequency adjustment is performed on a plurality of voltage-controlled oscillators remaining on a lead frame without being separated from the lead frame. The frequency of a large number of voltage-controlled oscillators may be adjusted at the same time to reduce the time required for producing and evaluating the voltage-controlled oscillator. In a twenty-sixth embodiment, the piezoelectric resonator and variable-capacitance diode are connected in series between the input and output terminals of an inverter of the semiconductor integrated circuit. A DC-cutting capacitor is disposed between the variable-capacitance diode and the inverter. The node between the piezoelectric resonator and the variable-capacitance diode is also connected to ground by a bias resistor and a signal is applied to the node between the variable-capacitance diode and the DC-cutting capacitor to allow the oscillation frequency of the voltage-controlled oscillator to vary over a wider range than conventional voltage-controlled oscillators. The wide range in the variation of the frequency is due to the phase difference between the terminals of the variable-capacitance diode.

While the invention has been described in relation to preferred embodiments, many modifications and variations are apparent from the description of the invention. All such modifications and variations are intended to be within the scope of the present invention as defined in the appended claims.

What is claimed is:

1. A voltage-controlled oscillator comprising:
    a semiconductor integrated circuit including at least an inverter;
    a piezoelectric resonator; and
    a variable-capacitance diode, wherein said piezoelectric resonator and said variable capacitance diode are connected in series between input and output terminals of said inverter, wherein a DC-cutting capacitor is disposed between said variable-capacitance diode and said inverter, a first node located between said piezoelectric resonator and said variable-capacitance diode is connected to ground by a bias resistor, and a signal is applied to a second node located between said variable-capacitance diode and said DC-cutting capacitor.

2. The voltage-controlled oscillator of claim 1, wherein said piezoelectric resonator is a quartz-crystal resonator.

3. The voltage-controlled oscillator of claim 1, further comprising a lead frame, wherein said semiconductor integrated circuit mounted on an island of a lead frame and being electrically connected to an inner lead of said lead frame by a wire-bonded wire, said piezoelectric resonator being disposed adjacent to said semiconductor integrated circuit, a lead of said piezoelectric resonator being electrically connected to said lead frame, said variable-capacitance diode mounted on a land of said lead frame and being electrically connected to said lead frame, a first connecting portion of said lead frame and said lead of said piezoelectric resonator is located on a same straight line as a second connecting portion of said lead frame and said variable-capacitance diode, wherein said piezoelectric resonator, said variable-capacitance diode and said lead frame are resin molded into a single unit, an outer part of said inner lead being exposed to an outside.

4. The voltage-controlled oscillator of claim 3, wherein said piezoelectric resonator has a case in a cross-section shape of one of an elliptic shape or a track shape.

5. The voltage-controlled oscillator of claim 4, wherein said piezoelectric resonator is a quartz-crystal resonator.

6. The voltage-controlled oscillator of claim 3, further comprising a signal input lead terminal electrically connected to said semiconductor integrated circuit to control data in said semiconductor integrated circuit, said signal input lead terminal being exposed to said outside, wherein an oscillation frequency is adjusted by applying a signal to said signal input lead terminal.

7. The voltage-controlled oscillator of claim 6, wherein said piezoelectric resonator has a case in a cross-section shape of one of an elliptic shape or a track shape.

8. The voltage-controlled oscillator of claim 7, wherein said piezoelectric resonator is a quartz-crystal resonator.

9. A voltage-controlled oscillator comprising:
a semiconductor integrated circuit mounted on an island of a lead frame and being electrically connected to an inner lead of said lead frame by a wire-bonded wire;
a piezoelectric resonator being disposed adjacent to said semiconductor integrated circuit;
a lead of said piezoelectric resonator being electrically connected to said lead frame; and
an electronic component mounted on a land of said lead frame and being electrically connected to said lead frame, wherein said piezoelectric resonator, said electronic component and said lead frame are resin molded into a single unit, an outer part of said inner lead being exposed to an outside, wherein a first connecting portion of said lead frame and said lead of said piezoelectric resonator is located on a same straight line as a second connecting portion of said lead frame and said electronic component.

10. The voltage-controlled oscillator of claim 9, wherein said electronic component is a variable-capacitance diode.

11. The voltage-controlled oscillator of claim 9, wherein said piezoelectric resonator has a case in a cross-section shape of one of an elliptic shape or a track shape.

12. The voltage-controlled oscillator of claim 11, wherein said piezoelectric resonator is a quartz-crystal resonator.

13. The voltage-controlled oscillator of claim 9, further comprising a signal input lead terminal electrically connected to said semiconductor integrated circuit to control data in said semiconductor integrated circuit, said signal input lead terminal being exposed to said outside, wherein an oscillation frequency is adjusted by applying a signal to said signal input lead terminal.

14. The voltage-controlled oscillator of claim 13, wherein said electronic component is a variable-capacitance diode.

15. The voltage-controlled oscillator of claim 13, wherein said piezoelectric resonator has a case in a cross-section shape of one of an elliptic shape or a track shape.

16. The voltage-controlled oscillator of claim 15, wherein said piezoelectric resonator is a quartz-crystal resonator.

* * * * *

UNITED STATES PATENT AND TRADEMARK OFFICE
CERTIFICATE OF CORRECTION

PATENT NO. : 5,745,012

DATED : April 28, 1998

INVENTOR(S) : Manabu OKA, Yukari NAKAJIMA, Masayuki KIKUSHIMA, and Kazuhiko SHIMODAIRA It is certified that error appears in the above-indentified patent and that said Letters Patent is hereby corrected as shown below:

Title page and Column 1, change the title "VOLTAGE-CONTROLLED OSCILLATOR HAVING A SEMICONDUCTOR INTEGRATED CIRCUIT, A PIEZOELECTRICS RESONATOR AND A DIODE AND VARIABLE-CAPACITANCE DIODE" to --VOLTAGE-CONTROLLED OSCILLATOR HAVING A SEMICONDUCTOR INTEGRATED CIRCUIT, A PIEZOELECTRIC RESONATOR AND A VARIABLE-CAPACITANCE DIODE--.

Signed and Sealed this

Fourteenth Day of July, 1998

Attest:

BRUCE LEHMAN

*Attesting Officer*  *Commissioner of Patents and Trademarks*